United States Patent
Limbacher et al.

(10) Patent No.: US 12,407,149 B2
(45) Date of Patent: Sep. 2, 2025

(54) EXPLOSION-PROOF HOUSING

(71) Applicant: R. STAHL SCHALTGERÄTE GMBH, Waldenburg (DE)

(72) Inventors: Bernd Limbacher, Schwäbisch Hall (DE); Elena Kondrus, Künzelsau (DE); Holger Semrau, Satteldorf (DE)

(73) Assignee: R. STAHL SCHALTGERATE GMBH, Waldenburg (DE)

( * ) Notice: Subject to any disclaimer, the term of this patent is extended or adjusted under 35 U.S.C. 154(b) by 406 days.

(21) Appl. No.: 17/778,342

(22) PCT Filed: Nov. 6, 2020

(86) PCT No.: PCT/EP2020/081342
§ 371 (c)(1),
(2) Date: May 19, 2022

(87) PCT Pub. No.: WO2021/099147
PCT Pub. Date: May 27, 2021

(65) Prior Publication Data
US 2022/0399701 A1    Dec. 15, 2022

(30) Foreign Application Priority Data
Nov. 19, 2019   (DE) .......................... 102019131195.0

(51) Int. Cl.
*H05K 5/02* (2006.01)
*H02B 1/28* (2006.01)
(Continued)

(52) U.S. Cl.
CPC .............. *H02B 1/28* (2013.01); *H02G 3/088* (2013.01); *H05K 5/0209* (2022.08); *H05K 5/0221* (2013.01); *H05K 5/10* (2025.01)

(58) Field of Classification Search
CPC ...... H02B 1/28; H05K 5/0004; H05K 5/0013; H05K 5/0209; H05K 5/0221
(Continued)

(56) References Cited

U.S. PATENT DOCUMENTS

| 4,600,114 A | 7/1986 | Dabich |
| 5,080,985 A * | 1/1992 | Wiacek ............... H01M 50/154 |
| | | 429/174 |

(Continued)

FOREIGN PATENT DOCUMENTS

| CN | 1053864 A | 8/1991 |
| CN | 205542933 U | 8/2016 |

(Continued)

OTHER PUBLICATIONS

English Translation CN110459703; Chen et al. Guangdong Weidian New Energy Co Ltd; Published Nov. 15, 2019 (Year: 2019).*
(Continued)

*Primary Examiner* — Steven T Sawyer
(74) *Attorney, Agent, or Firm* — CANTOR COLBURN LLP

(57) ABSTRACT

An explosion-proof housing, which forms an interior for accommodating components that can form ignition sources. The housing has a first housing part with a first section which has a first face, and a second housing part with a second section which has a second face, the first section and/or the second section being a section of a wall, the first face and the second face delimiting an intermediate region. The first section and the second section are pressed against each other with elastic deformation of the wall section so that the intermediate region is geometrically closed in a flameproof manner by the elastic deformation of the wall section. The invention also relates to a method for producing an explosion-proof connection between a first section of a (Continued)

first housing part with a first face and a second section of a second housing part with a second face of a housing, at least one of the sections being a section of a wall. The invention also relates to a further method for producing an explosion-proof connection between a first section of a first housing part with a first face and a second section of a second housing part with a second face of a housing, at least one of the sections being a section of a wall.

18 Claims, 16 Drawing Sheets

(51) Int. Cl.
    *H02G 3/08* (2006.01)
    *H05K 5/10* (2025.01)
(58) Field of Classification Search
    USPC .................................................. 220/89.1
    See application file for complete search history.

(56) References Cited

U.S. PATENT DOCUMENTS

| | | | | |
|---|---|---|---|---|
| 5,880,400 | A * | 3/1999 | Leischner | H02B 1/28 |
| | | | | 174/17 CT |
| 6,753,473 | B2 | 6/2004 | Barlian et al. | |
| 9,272,821 | B2 * | 3/2016 | Manahan | H02G 3/088 |
| 9,492,694 | B2 | 11/2016 | Mann et al. | |
| 2006/0222938 | A1 * | 10/2006 | Yoshioka | H01M 50/193 |
| | | | | 429/174 |
| 2011/0002494 | A1 * | 1/2011 | Opitz | B22F 3/1125 |
| | | | | 381/334 |
| 2013/0206759 | A1 | 8/2013 | Wurz et al. | |
| 2015/0060445 | A1 | 3/2015 | Mann et al. | |
| 2015/0076156 | A1 | 3/2015 | Manahan et al. | |
| 2018/0348021 | A1 * | 12/2018 | Ziems | G01D 11/26 |
| 2021/0057684 | A1 * | 2/2021 | Okutani | H01M 50/147 |
| 2021/0100112 | A1 * | 4/2021 | Haag | H05K 5/0013 |
| 2022/0294086 | A1 * | 9/2022 | Chen | H01M 50/536 |

FOREIGN PATENT DOCUMENTS

| | | |
|---|---|---|
| CN | 110459703 A | 11/2019 |
| DE | 1801062 A | 10/1969 |
| DE | 2617965 B2 | 10/1977 |
| DE | 3436300 C2 | 5/1993 |
| DE | 19959384 A1 | 10/2001 |
| DE | 102007003009 A1 | 7/2008 |
| DE | 102010016782 A1 | 11/2011 |
| DE | 102013203191 A1 | 8/2014 |
| DE | 102013109261 A1 | 3/2015 |
| DE | 102013111374 A1 | 4/2015 |
| EP | 3087313 A1 | 11/2016 |
| FR | 1174709 A | 3/1959 |
| GB | 778040 A | 7/1957 |
| GB | 1583191 A | 1/1981 |
| JP | 2018060880 A | 4/2018 |
| RU | 2578116 C2 | 3/2016 |

OTHER PUBLICATIONS

English Translation of International Search Report for International Application No. PCT/EP2020/081342; Date of Completion: Feb. 4, 2021; Date of Mailing: Feb. 11, 2021; 3 Pages.
German Office Action for German Application No. 102019131195.0 Issued Sep. 4, 2020; 8 Pages.
International Search Report for International Application No. PCT/EP2020/081342; Date of Completion: Feb. 4, 2021; Date of Mailing: Feb. 11, 2021; 5 Pages.
Machine Translation of DE2617965B2; 12 Pages.
Written Opinion for International Application No. PCT/EP2020/081342; International Filing Date: Nov. 6, 2020; 7 Pages.
English Translation of Written Opinion for International Application No. PCT/EP2020/081342; International Filing Date: Nov. 6, 2020; 8 Pages.
Chinese Office Action corresponding to CN Application No. 2020800799060; Issue date, Jun. 28, 2024.
Chinese Search Report for CN Application No. 2020800799060; Issue date, Jun. 28, 2024.
Office Action dated Aug. 22, 2023; RU Application No. 2022106635/07; 12 pages (non-English).
Chinese Search Report corresponding to CN Application No. 2020800799060; Issue Date, Apr. 8, 2025, 4 pages.
CNIPA Second Office Action corresponding to CN Application No. 2020800799060; Issue Date, Apr. 8, 2025, 36 pages.

* cited by examiner

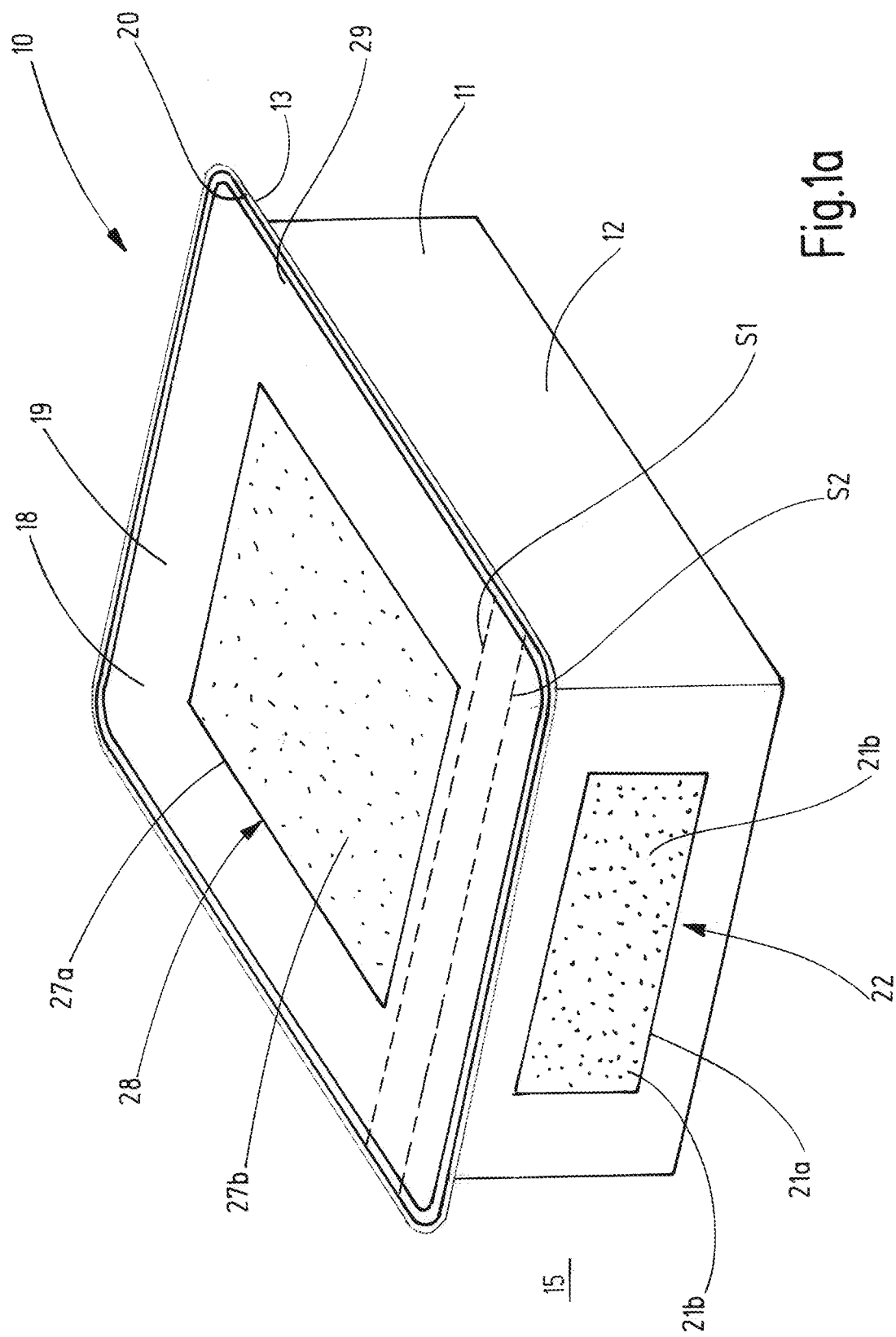

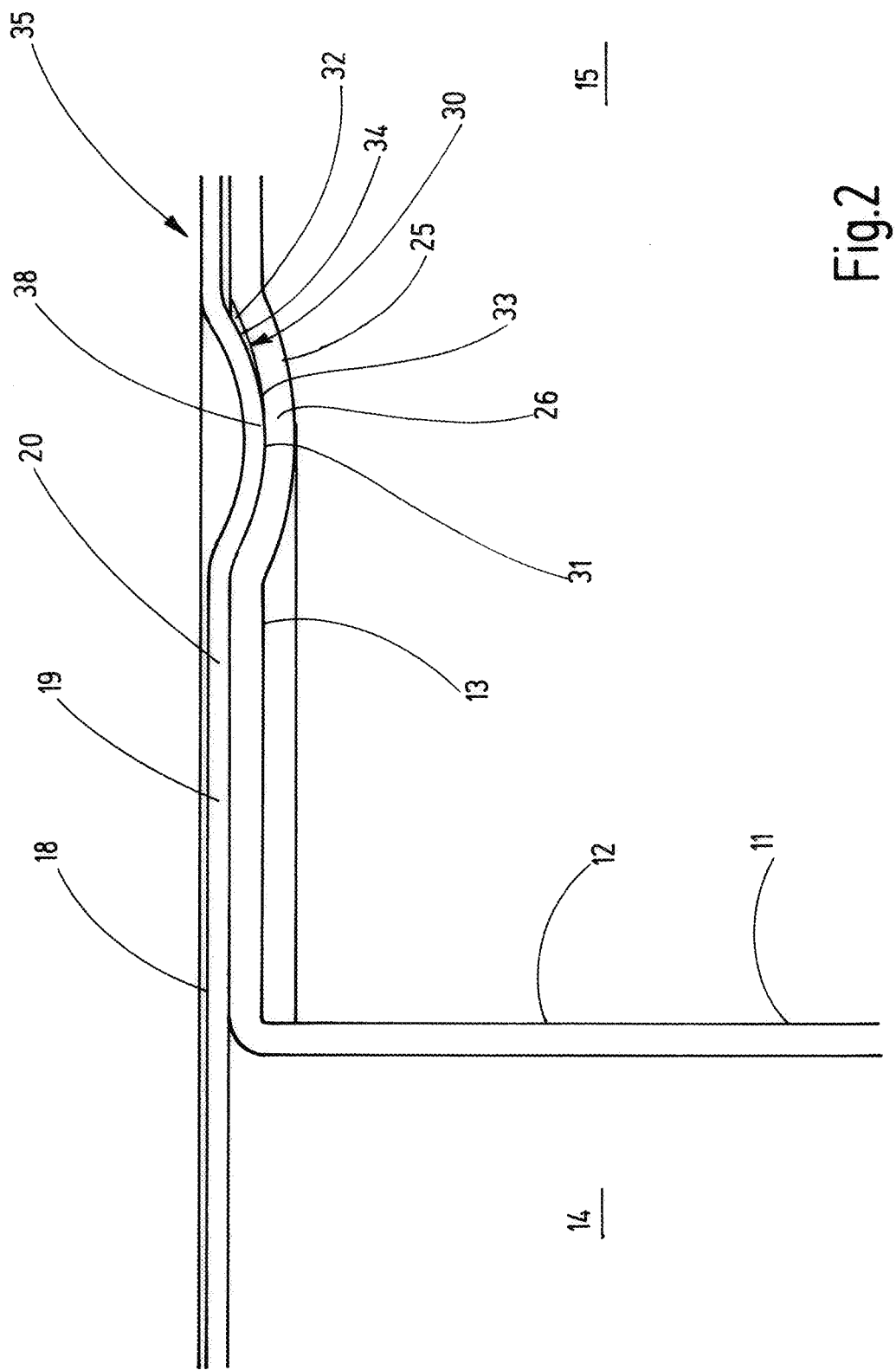

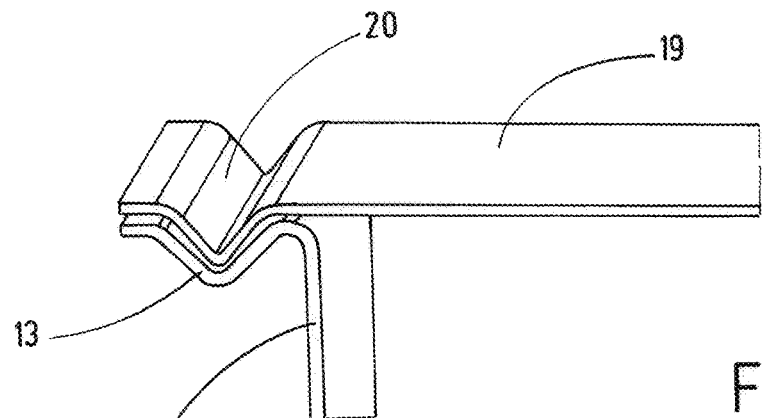
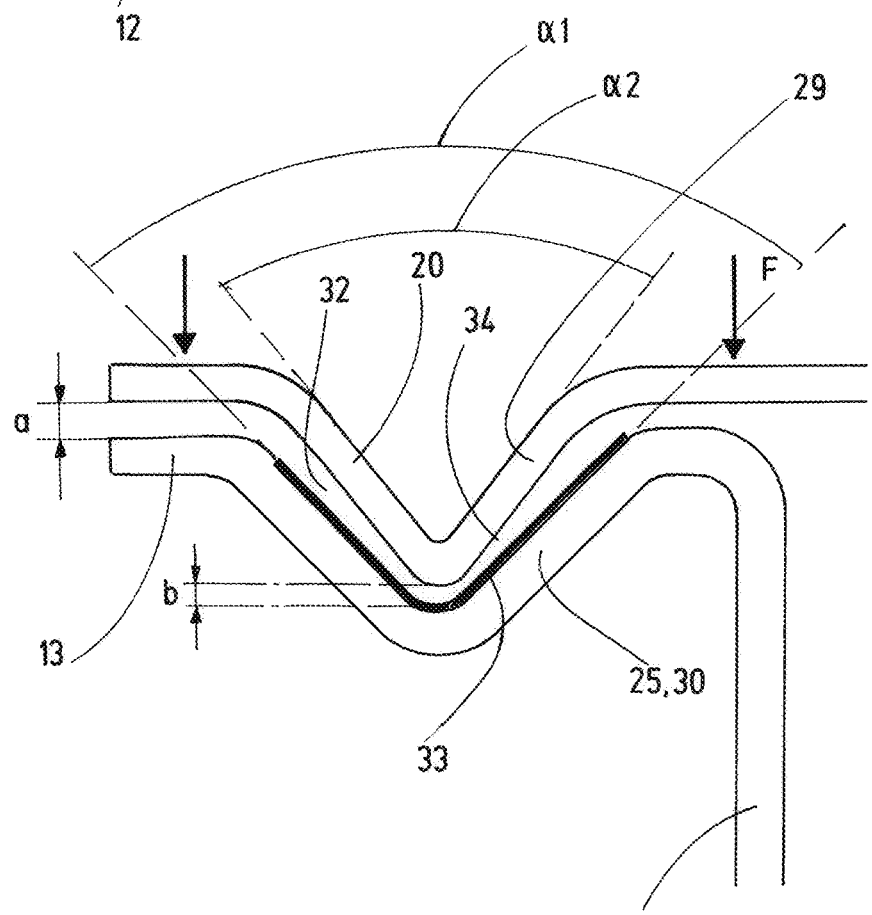
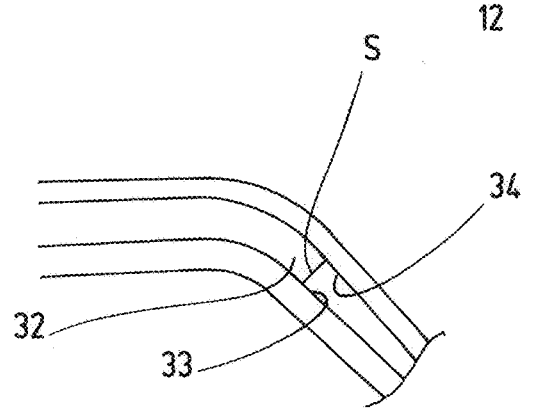
Fig.6a
Fig.6b
Fig.6c

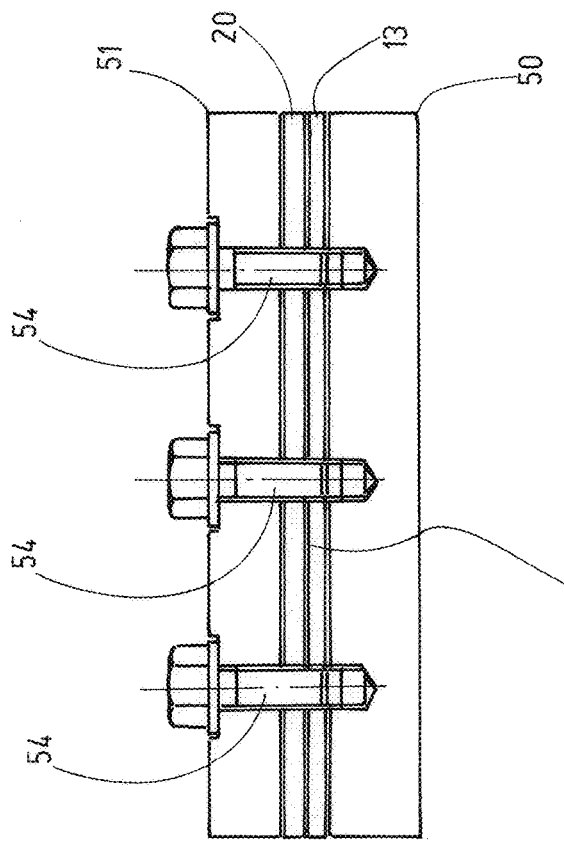
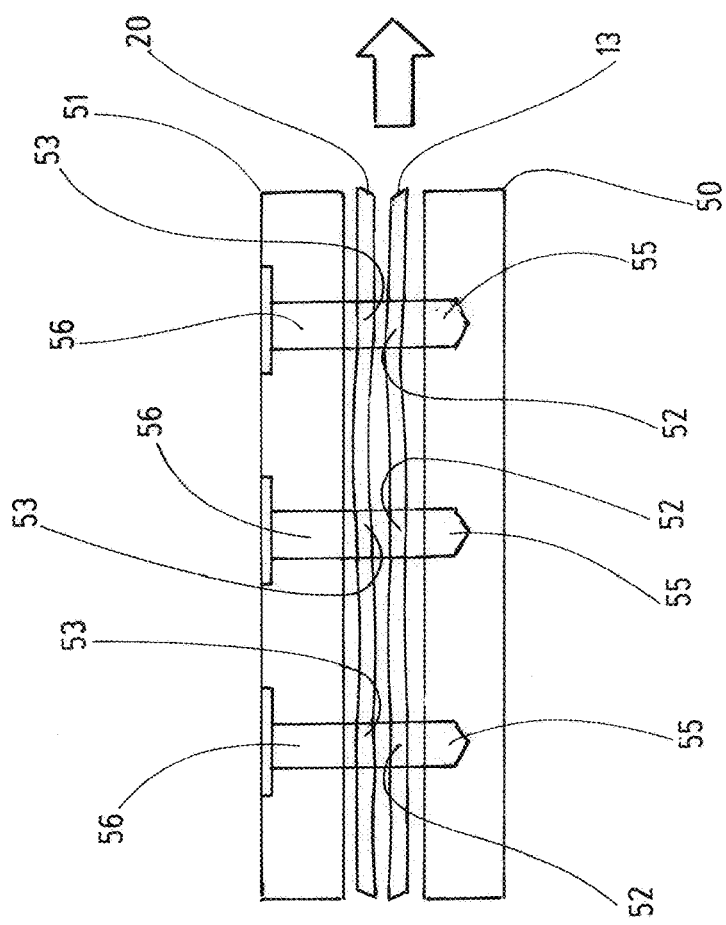
Fig.10c

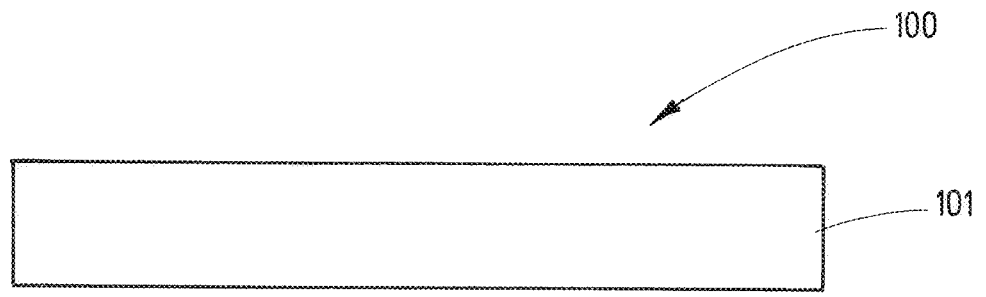
Fig.12a
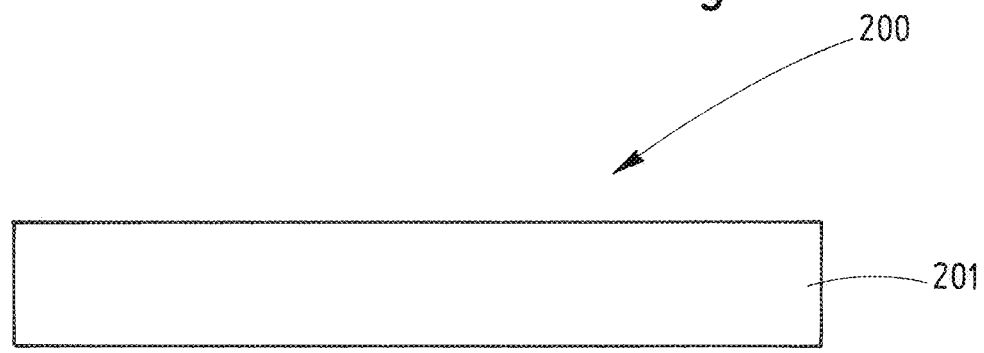
Fig.12b

EXPLOSION-PROOF HOUSING

CROSS REFERENCE TO RELATED APPLICATIONS

This application is a National Stage of PCT Application No. PCT/EP2020/081342 filed on Nov. 6, 2020, which claims priority to German Patent Application No. 10 2019 131 195.0 filed on Nov. 19, 2019, the contents each of which are incorporated herein by reference thereto.

TECHNICAL FIELD

The invention refers to an explosion-proof housing, preferably in the protection category "flameproof enclosure".

BACKGROUND

From the prior art housings are known that are configured according to the explosion protection category "flameproof enclosure". This allows the collection of an explosive gas mixture inside the housing and an explosion thereof due to ignition sparks formed by an electrical operation device inside the housing. According to the protection category, it is also allowed that gas or particles may escape during the explosion through gaps from the interior of the housing outside where potentially explosive atmosphere is present. However, according to the explosion protection category, it has to be excluded that the gas is so hot or else the particles are so hot or glow that the explosive atmosphere outside the housing can be ignited.

DE 10 2010 016 782 A1 describes a pressure relief device for flameproof enclosures. It is configured to be arranged in a housing part and to reduce the amount of pressure peaks created during an explosion-like reaction in the interior in that created gases can quickly and easily flow out of the housing through the pressure relief device.

From DE 34 36 300 C2 an apparatus housing having an explosion-proof chamber is known. The housing comprises a shell as first housing part and a cover as second housing part. Shell and cover comprise corresponding flanges in order to produce a flange connection between the shell and the cover. Gaps through which gas between the flanges are allowed through which gas or particles can escape from the interior of the housing outwardly during an explosion. They are, however, dimensioned such that gas ignited inside the hollow space of the housing cools sufficiently before it exits the housing through the gaps between the flanges. A sealing can be arranged between the flanges in order to avoid ingress of humidity into the housing.

In order to comply with the gap dimensions for a flameproof gap, the opposed flange surfaces are manufactured with relatively narrow manufacturing tolerances in the housings known from the prior art. For closing of the housing the flanges are arranged against one another for forming a flameproof gap and the flameproof gap between the flanges is secured in that the flanges are pressed against each other.

A housing that is denoted as being flameproof is known from DE 26 17 965 B2 that comprises a housing bottom part and a housing top part. The two parts create an interstice that is denoted as gap space. Between the housing top part and the housing bottom part a sealing is arranged at the gap space. Together with spring elements it serves to hold the housing bottom part and the housing top part together. The spring elements are arranged in the interstice. The interstice is filled with cast resin. It is indicated that by filling the gap with cast resin, a flameproof housing would be obtained, which is configured without gap.

DE 10 2007 003 009 A1 describes a method for manufacturing of fluid-tight housings as well as a fluid-tight housing. The housing comprises a base part and a plate-like cover as well as a sealing for a fluid-tight sealing of the housing interior arranged between joining surfaces of base part and cover facing one another. The base part and the cover are attached to one another in a biased manner, such that the elastic sealing is deformed. In doing so, it is excluded that gas from the environment of the housing reaches an ignition source that is arranged inside the fluid-tight housing.

An explosion-proof arrangement for electrical and/or electronic components is known from DE 10 2013 111 374 A1. The arrangement comprises a support and a cover. The cover defines at least one location chamber for the components. Between the cover and the support an elastic coupling element is arranged that surrounds the opening in the cover completely. If the cover and the support are connected by means of a force-fit and/or form-fit connection, the coupling element is elastically deformed between the cover and the support. With the explosion-proof arrangement requirements shall be complied with that are defined for an encapsulation (Ex-m) or a flameproof enclosure (Ex-d). With the encapsulation (Ex-m) an explosive atmosphere is kept away from the interior of a housing.

DE 1 801 062 A describes a flameproof housing made from steel sheet parts connected by means of welding. The housing comprises a ring that is inserted in an opening in a wall of the housing by means of a welded connection. The ring comprises a conical mating surface as seat for a cover. The cover can be held on the housing by means of a bayonet-like lock. A mating between the ring and the cover requires compliance of narrow tolerances, which increases the costs for manufacturing.

GB 778 040 discloses a housing having a part that defines an interior of the housing and that comprises an opening that allows access to the interior when the housing is opened and having a second part for closing the opening. An elastically deformed open-pored element is arranged between the first part and the second part that closes the interstice between the first part and the second part in a flameproof manner. If the housing can be repeatedly closed without exchange of the element, care has to be taken that the element is not damaged in the opened condition.

BRIEF SUMMARY

It can be considered as object to provide an improved concept for an explosion-proof housing.

An explosion-proof housing that forms an interior for location of components that can form ignition sources, the explosion-proof housing having a first housing part with a first section that comprises a first face and a second housing part with a second section that comprises a second face, wherein the first section and/or the second section is a wall section, wherein the first face and the second face limit an intermediate region, wherein the first section and the second section are pressed against one another under elastic deformation of the wall section, such that the intermediate region is geometrically closed in a flameproof manner due to the elastic deformation of the wall section.

A method for manufacturing an explosion-proof housing that forms an interior for location of components that can form ignition sources, the explosion-proof housing having a first housing part with a first section that comprises a first face and a second housing part with a second section that comprises a second face, wherein the first section and/or the second section is a wall section, wherein the first face and the second face limit an intermediate region, wherein the first section and the second section are pressed against one another under elastic deformation of the wall section, such that the intermediate region is geometrically closed in a flameproof manner due to the elastic deformation of the wall section, comprising: selecting of the first section and the second section for limiting the intermediate region of the housing, wherein the intermediate region is geometrically closed in a flameproof manner due to the elastic deformation of the wall section.

The explosion-proof housing forms an interior for location of components that can form ignition sources. The housing comprises a first housing part with a first section that has a first face and a second housing part having a second section that has a second face. The first section and/or the second section is a wall section. The wall, the section of which is the first section or the second section, can be a side wall, a bottom or a back or a cover or another closure (e.g. a front closure or a backside closure). The first face and the second face limit an intermediate region that is a separation location of the housing. The first section and the second section are pressed against one another under elastic deformation of the wall section directly and/or indirectly via at least one intermediate layer, such that the intermediate region is geometrically closed in a flameproof manner due to the elastic deformation of the wall section.

According to the invention, a method for manufacturing a housing is provided, e.g. of a herein described housing according to the invention. The method comprises the selection of a first section and a second section for limiting the intermediate region of the housing, wherein at least one of the sections of a wall section is such that the first section and the second section are pressed against one another under elastic deformation of the wall section, such that the intermediate region is geometrically closed in a flameproof manner due to the elastic deformation of the wall section.

Another method according to the invention serves for manufacturing of an explosion-proof connection between a first section of a first housing part having a first face and a second section of a second housing part having a second face. This method can be applied to a housing according to the invention described herein, for example. The method comprises the assembly of the first housing part and the second housing part in order to close the housing, wherein the first face and the second face limit an intermediate region that has a gap dimension outside a flameproof range. The sections are applied with a force such that the intermediate region is geometrically closed in a flameproof manner due to the elastic deformation of the wall section.

In embodiments the intermediate region can be closed up to a width of zero, that is it can be a flameproof zero gap, or in the intermediate region a flameproof gap having the gap width equal to zero can be formed.

In the prior art for producing a flameproof connection between two elements of a housing between which a flameproof gap is formed, the housing parts are formed, particularly post-machined, such that they match with each other for forming of the flameproof gap between the housing parts. According to the invention, a gap that complies with the maximum length and width for flameproof condition is only reliably formed during pressing of first and second sections against each other under elastic deformation of the at least one wall section. A pressing of the second housing part against the first housing part serves consequently not to secure a flameproof gap that is already created during abutment of two faces of the housing parts—as in the prior art—but the formation of the flameproof gap dimensions is only guaranteed by deformation of the first section and/or the second section in connecting the second housing part with the first housing part.

The deformation of the first section and/or the second section results preferably in a deformation of the face of the first section and/or the face of the second section and/or a reduction of an angle defined by the faces, wherein the faces define the width of the intermediate region and thus to reduction of the width of the intermediate region, such that the intermediate region is closed in a flameproof manner. The first section and the second section can form a wedge gap, wherein the gap can obtain the wedge shape as desired shape based on the desired shapes of the first section and the second section or wherein the gap can obtain the wedge shape due to a predefined shape deviating from the desired shapes of the first section and the second section. Due to the elastic deformation the wedge gap is further closed, wherein the wedge gap can maintain or lose its wedge shape.

The concept according to the invention poses minor requirements on tolerances of the housing part limiting the separation location. The inventive concept also allows intermediate regions that deviate from a flat gap shape, such as domed gaps (e.g. U-shaped gaps in cross-section) or for example V- or W-shaped gaps.

According to the invention, the deformation of the first housing part and/or the second housing part can be specifically used to compensate rough tolerances of the first housing part/second housing part or a specifically deviating shape by means of the deformation. Deforming is used as means for establishing the flameproof condition.

For example, the explosion-proof housing can be configured in the protection category "flameproof enclosure" according to the standard (DIN EN 600-79/1) or an American standard (for example).

Further advantageous optional features and embodiments of the housings according to the invention and the methods according to the invention are, for example, derived from the following description:

In embodiments of the housing the first section of the first housing part and/or the second section of the second housing part is a sheet section. If the first housing part and/or the second housing part are sheet parts, housings with remarkably low weight can be produced. The first housing part and/or the second housing part can be deep-drawn sheet parts. The sheet thickness of the first section and/or the sheet thickness of the second section can be in embodiments, for example, 5 mm or less, e.g. 3 mm or less. The smaller the sheet thickness, the less is also the force required for the deformation for the flameproof closing.

In preferred embodiments of the explosion-proof housing the first section and the second section press against one another under elastic deformation of the second section as well as the first section in order to close the intermediate region between the first section and the second section in a flameproof manner. In such embodiments a deformation of the second section as well as a deformation of the first section toward each other contribute significantly to close the intermediate region in a flameproof manner. Preferably the elastic deformability of the first section of the first housing part and the elastic deformability of the second section of the second housing part have such an amount that the first section and the second section travel path lengths toward each other during deformation for flameproof closing the intermediate region, the lengths of which deviate from each other at most by a factor of 10.

The first housing part and the second housing part can have predefined shapes, such that they limit the intermediate region that is configured to be closed in a flameproof manner by clamping with a width that is different to zero during direct abutment of the second housing part on the first housing part at least in the condition being not pressed against one another in a flameproof manner.

The first section and the second section can have predefined shapes deviating from each other. Predefined shapes are such shapes and/or dimensions in a predefined tolerance range around the specified shape (desired shape).

The first section and the second section comprise—at least without the elastic deformation—no shape matching to each other that a flameproof intermediate region geometry would also be present without deformation and are thus far no matching surfaces. At least without the elastic deformation the first section and the second section (the faces thereof) can have desired shapes or predefined shapes highly deviating from one another.

The first section and the second section can have different desired shapes such that an abutment of the first housing part on the second housing part in the non-clamped condition of the first section and the second section, the first section and the second section include an angle due to the geometric desired shapes.

The width of the intermediate region, at least in a condition when the first housing part and the second housing part are supported on one another and not pressed against each other in a flameproof manner, can increase from a support region in direction toward the environment of the housing and/or in direction toward the interior due to the desired shape of the first section and the second section.

Preferably the section is directly or indirectly supported in a predefined support region on the counter section during flameproof closing of the intermediate region by means of elastic deformation, whereby the support region forms an inner edge and/or an outer edge of the intermediate region and/or whereby the support region is arranged between an inner edge and an outer edge of the intermediate region.

The first section and/or the second section can form bending springs and/or arms of a one-side-lever that are moved relative toward each other distant from the support region during elastic deformation for the flameproof closing.

An angle that the sections enclose prior to deformation due to deviating desired shapes and/or deviating predefined shapes can be reduced (e.g. down to zero) during deformation. The first section and/or the second section are matched to each other only by means of deformation. Under "matching" the process is meant approaching complementary shapes of the sections without necessarily having to reach the complementary shapes. For the flameproof closing it is not necessarily required that this process results in a complementary shape. Rather the intermediate region geometry can also be in the range of the geometry of flameproof gaps without reaching of complementary shapes due to deformation, wherein the intermediate region can be void or filled after deformation. The first section and the second section can obtain complementary shapes due to the deformation. In other embodiments an angle is at least reduced due to the deformation that existed between the surfaces of the first section and the second section prior to the deformation.

The first section and/or the second section can form a longitudinal seat, e.g. a bead. For example, the seat can be U-shaped, V-shaped or W-shaped in cross-section of the first section and/or the second section. The second section and/or the first section comprise a longitudinal dome that is located in the seat. In embodiments the opposed faces of the dome and the seat comprise shapes deviating from one another in a condition in which they are not pressed against each other in flameproof manner, e.g. V-shapes with different opening angles or U-shapes with different curvatures. During clamping of the first section and the second section for creation of the flameproof condition the first section and/or the second section and thus the faces can be deformed in embodiments such that the shapes two-dimensionally abut against one another that were previously not complementary. If the first section and/or the second section are deformed, the surface of the sheet element can two-dimensionally contact the surface of the additional element. The flameproof intermediate region can form a gap of gap width zero. The intermediate region can be particularly a gap of the gap width zero.

The intermediate region can be free of a solid body filling in the clamped condition or can be filled with an elastically deformed solid body. In embodiments an elastically deformed intermediate layer can be arranged between the first section and the second section by means of which the first section and the second section are pressed against one another. An elastically deformed intermediate element can be arranged between the first section and the second section. The first section and the second section can be pressed against one another via the intermediate element. The intermediate layer and/or the intermediate element can be separate from the first section and/or the second section or can be connected with the first section or the second section in a substance bond manner, e.g. adhesively connected. For example, the intermediate element can be frame-shaped in order to surround an opening of the housing. The intermediate element can consist of plastic.

The intermediate region can include an angle different from zero degrees relative to a dimension direction (e.g. longitudinal direction, width direction, height direction), i.e. a direction in which a dimension of the housing is measured. In known housings with flameproof flat gaps the flat gap is, for example, formed parallel to the width direction of the housing or to the longitudinal direction of the housing or to the height direction of the housing. If an intermediate region, particularly a gap-shaped intermediate region, confines an angle with a dimension direction, the housing can have a dimension in this direction that is less as if the intermediate region would be orientated parallel to the dimension direction, for example. This allows the manufacturing of particularly compact housings or housings with optimized large inner volumes.

In preferred embodiments the intermediate region and/or the first face and/or the second face that limit the intermediate region are orientated obliquely relative to a wall of the housing. The intermediate region and/or the first section and/or the second section can confines an angle with the wall of the housing different from 90° that is larger than 0° and smaller than 180°. The intermediate region, the first section and/or the second section can particularly project obliquely from a wall of the housing indeed outwardly or inwardly.

For example, the first section and/or the second section can be a section projecting from a wall of the housing outwardly, i.e. in direction toward the environment of the housing, or inwardly, i.e. in direction toward the interior of the housing.

In preferred embodiments the first section and/or the counter section comprises a device for defining a bending zone. For example, a bending zone can be defined by providing an area in the sheet material having a reduced wall thickness compared with another area of the first section. The area can be line-shaped. The area can particularly follow a straight line. The device can be a trough-shaped depression in the section or the counter section, for example. The bending zone can follow a straight line. A higher flexibility in the bending zone can be defined as an alternative or in addition to a reduced wall thickness by means of a structural change in an area of the sheet material, for example. Particularly, if a device for defining a bending zone in the section and/or the counter section is provided, shape changes during clamping can be remarkably accurately predefined. The material, particularly sheet material, of the section and/or the counter section can be configured specifically strong enough to be able to withstand an explosion on one hand and flexible enough in order to keep the expenditure of force for deformation for forming of the flameproof intermediate region low by providing such a device.

In preferred embodiments the housing can be reclosed. Preferably the first section and the second section can be repeatedly pressed against one another under elastic deformation of the one or the multiple wall sections for reclosing in order to close the intermediate region between the first section and the second section again in a flameproof manner.

Remarkably thin sheet strengths become possible, if the housing is assigned with an inner and/or outer pressure relief device. The pressure relief device that is preferably assigned to the housing is preferably configured and determined to limit the maximum overpressure that is created due to an explosion in the interior of the housing to a maximum value that is less than the maximum value that would occur in the same housing without the at least one pressure relief device.

The at least one device for explosion pressure reduction can comprise a pressure relief body that is arranged in or on an opening of the housing toward the environment of the housing in order to release gas from the interior of the housing in case of an explosion for relief purposes (outer pressure relief device). Such a pressure relief body is preferably configured in the protection category "flameproof enclosure" (e.g. Ex-d, EN 600 79-1).

As an alternative or in addition, the at least one device for explosion pressure reduction can comprise a device that is unable to release gas out of the housing that, however, can absorb thermal and/or kinetic energy of the explosion in order to limit the maximum overpressure in case of the explosion (inner pressure relief device).

The pressure relief device for reduction of the explosion pressure preferably comprises open-pored material. Open-pored material can effectively cool gas due to its large surface to reduce the maximum explosion pressure. For example, open-pored material can be fiber material, e.g. metal fiber material, e.g. fibers processed to form a woven fabric, a lead fabric or a fleece or can be formed from a bulk of pourable material.

For example, the pressure relief device can be configured and determined to limit the overpressure due to an explosion to a maximum value of 1000 millibars or less or particularly preferred to a maximum value of 500 millibars or less. The at least one pressure relief device for reduction of explosion pressure is preferably configured and determined to reduce an explosion overpressure (overpressure above atmospheric pressure) of some bar, particularly larger or equal to 10 bar that would occur, if the at least one device would not be provided in the otherwise non-modified housing, to an overpressure of less or equal to 1 bar, for example.

In embodiments the inner volume of the housing can have an amount of 1 liter or more, 10 liters or more, 50 liters or more, 100 liters or more, 500 liters or more or 1000 liters or more.

BRIEF DESCRIPTION OF THE DRAWINGS

Further optional advantageous features and embodiments are derived from the dependent claims, the following description as well as the figures. It is shown by way of example:

DETAILED DESCRIPTION

Figure 1B:
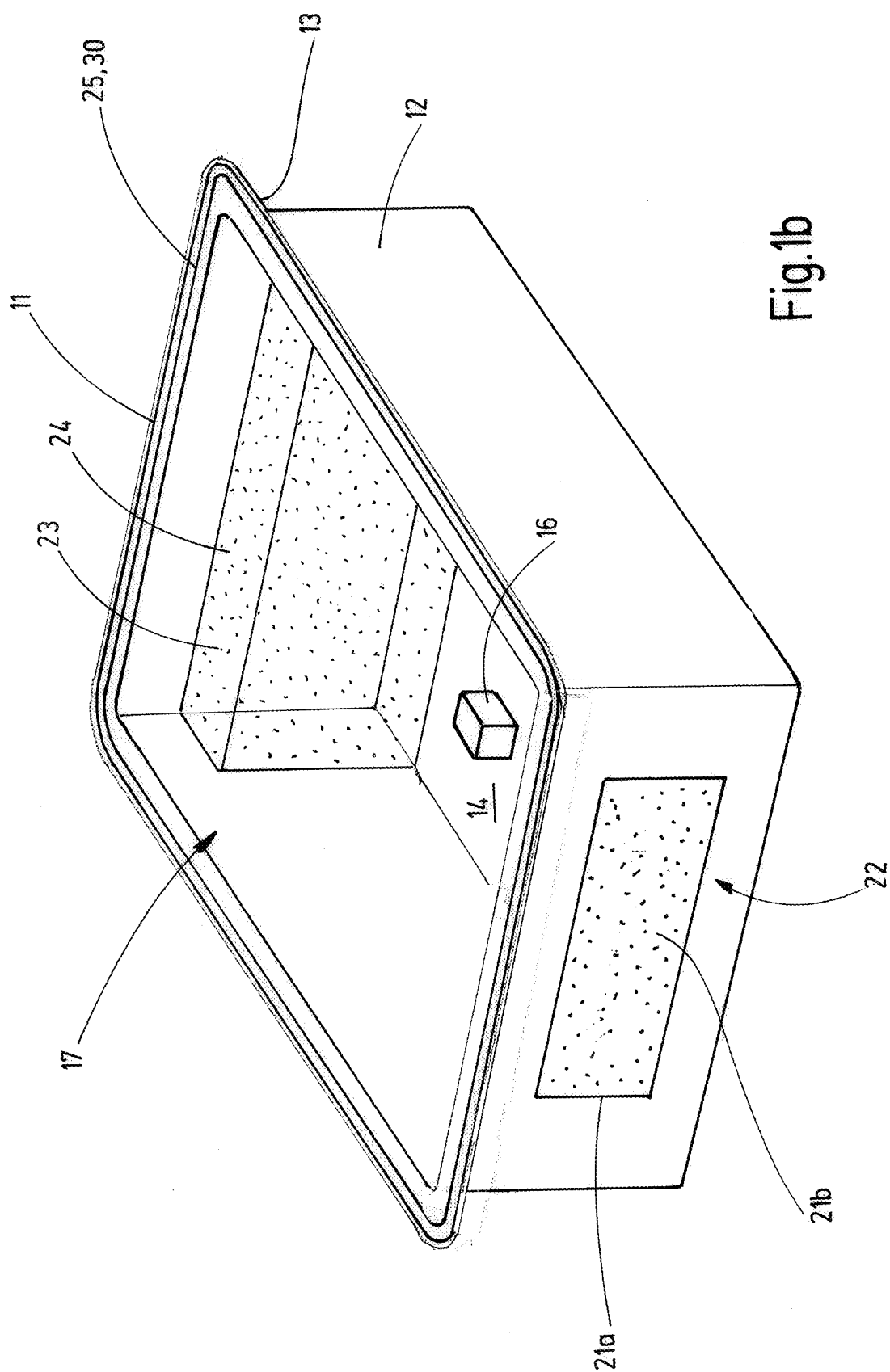
FIG. 1a—an example of a housing according to the invention in a perspective illustration, FIG. 1b—a first housing part of the housing according to FIG. 1a in a perspective illustration, FIG. 1c—a second housing part of the housing according to FIG. 1a, FIG. 2—a cross-sectional illustration through a first section and a second section of the housing according to FIG. 1a (along a part of cutting line S1), FIG. 3—a cross-sectional illustration through a first section and a second section of the housing according to FIG. 1a in clamped condition, FIG. 4—a part of the housing according to FIG. 1a (along the cutting lines S1 and S2 orthogonal to the second housing part) in perspective schematic illustration not true to scale, FIG. 5—a cross-sectional illustration through a first section and a second section of the housing according to FIG. 1a in the non-clamped condition along a part of cutting line S1, FIG. 6a—a sectional illustration of a modification of the housing according to FIG. 1a along a part of cutting lines S1 and S2, FIG. 6b—a cross-sectional illustration through the first section and the second section of the housing part of the housing according to FIG. 6a along a part of cutting line S1, FIG. 6c—a cross-sectional illustration schematically and in part through the first section and the second section according to FIG. 6b along a part of cutting line S1, FIG. 7—a cross-sectional illustration in part through a modification of the embodiment according to FIG. 6a along a part of cutting line S1, FIG. 8a, 8b—a cross-sectional illustration in part through a further modification of the embodiment according to FIG. 6a in the non-clamped (FIG. 8a) and in the clamped condition (FIG. 8b) along a part of cutting line S1, FIG. 9a—a part of the housing according to a further embodiment in perspective illustration along cutting lines S1 and S2 in a schematic manner not true to scale, FIG. 9b—a cross-sectional illustration in part of the embodiment according to FIG. 9b along the cutting line S1, FIG. 9c—a cross-sectional illustration in part through a medication of the embodiment according to FIG. 9a along the cutting line S1, FIG. 10a—a schematic cross-sectional illustration through a first and a second housing part of a further embodiment of the housing according to the invention, FIG. 10b—a schematic cross-sectional illustration through the housing with clamped first and second housing parts, FIG. 10c—an illustration of a modification of the embodiment according to FIGS. 10a and 10b, FIG. 11a, 11b—two exemplary views onto a face of a first section of the first housing part of the housing according to FIG. 10b, FIG. 12a—an illustration of an embodiment of a method according to the invention and FIG. 12b—an illustration of an embodiment of another method according to the invention.
Figure 1C:
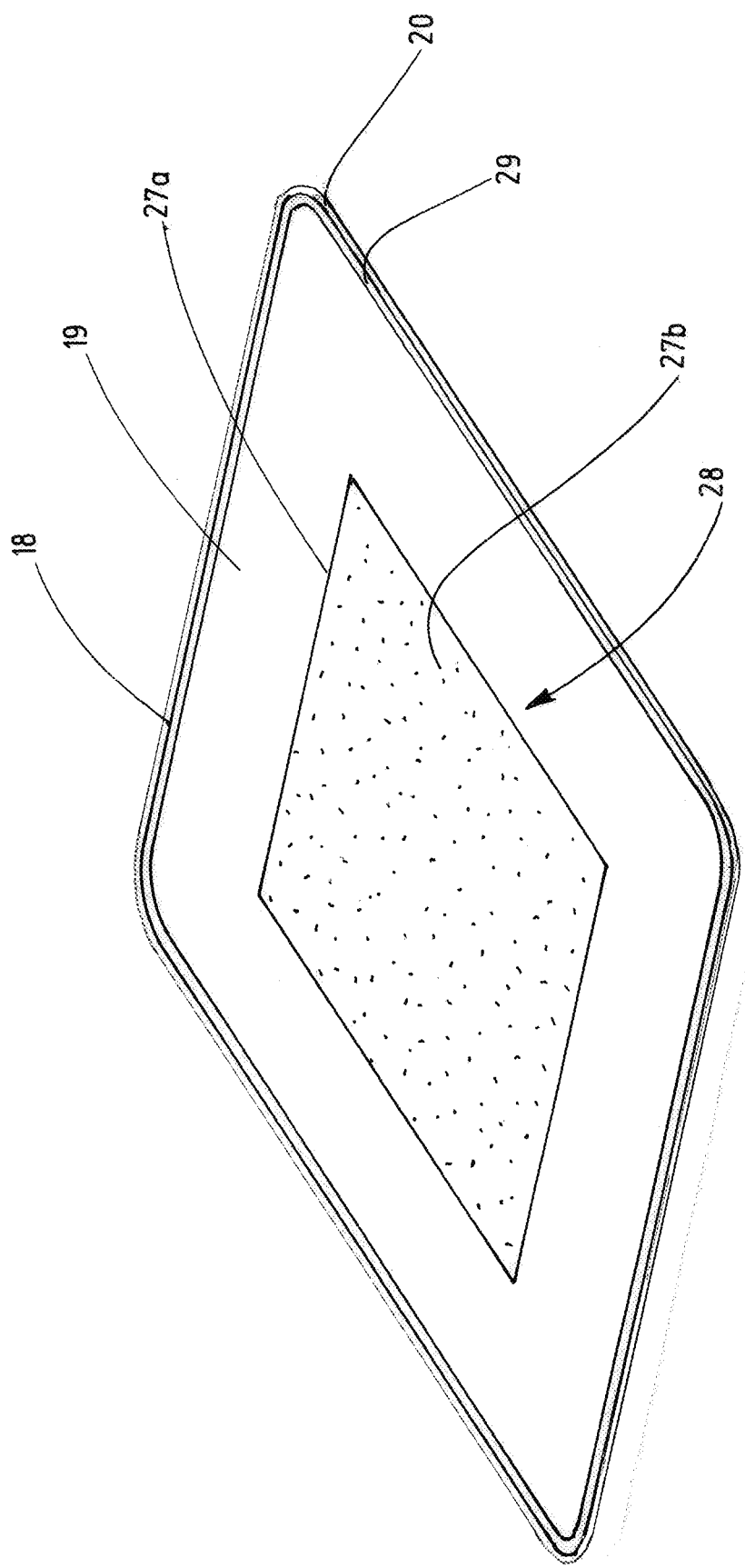

FIGS. 1a to 1c show an embodiment of an explosion-proof housing 10 according to an embodiment of the teaching according to the invention. The housing 10 comprises a tub- or container-shaped, e.g. cuboid or cylindrical, first housing part 11 that comprises a wall 12. The wall 12 comprises a first wall section (of a first section 13). The housing part 11 encloses an interior 14 of the housing 10 in circumferential direction in order to separate the interior 14 from the environment 15 of the housing 10. The interior 14 can be determined to arrange electrical or electronical components 16 in the interior 14 that could form ignition sources. The first housing part 11 defines an opening 17. The opening 17 is closed with a cover-shaped second housing part 18 that forms a wall of the housing 10 and thus a second wall section (a second section 20). Depending on the use of housing 10, second housing part 18 can form a back wall, a front wall, a side wall or a cover of the housing 10, for example.

The first housing part 11 can be manufactured from sheet material. The material of first housing part 11 is preferably free of flameproof open pores or gaps that would connect the interior 14 of housing 10 with the environment 15. However, on first housing part 11 an outer pressure relief device 21 having an open-pored pressure relief body 20 can be arranged and/or in the housing 10 an inner pressure relief device 23 can be arranged.

The inner pressure relief device 23 can be arranged in the interior 14, as apparent from FIG. 1b, particularly on a wall side or multiple wall sides of first housing part 11. The inner pressure relief device 23 comprises porous material 24. For example, this can be a bulk of loose particulate material and/or an open-pored body, e.g. a plastic or metal foam, an entangled fiber body, a body of one or multiple grid layers, whereby each grid layer can be woven, laid or manufactured in another manner. The inner pressure relief device 23 serves to absorb heat or kinetic energy from the explosion gas in case of an explosion in order to reduce the peak pressure that would occur inside housing 10 without the inner pressure relief device 23. The inner pressure relief device 23 is characterized in that it is able to reduce the peak pressure without allowing gas to escape from the interior 14 of housing 10.

On the wall of first housing part 11 that comprises a pressure relief opening 21a, a pressure relief body 21b can be arranged that closes the opening 21a in a flameproof manner. The opening 21a and the pressure relief body 21b form an outer pressure relief device 22. The outer pressure relief device comprises a pressure relief body 22 that comprises open pores that basically allow a gas exchange between the interior 14 of housing 10 and the environment 15 of housing 10, whereby however the pores form gaps with a maximum gap width and a minimum gap length such that hot gases and/or particles from the interior 14 of housing 10 exit the pressure relief body 22 into the environment 15 of housing 10 only cooled, such that they cannot ignite the ignitable atmosphere in the environment 15 of housing 10. The pressure relief body 22 is connected with wall 12, e.g. by overmolding, gluing, brazing, welding, clamping or the like, that hot gas and/or particles cannot pass around the pressure relief body, at least not without being cooled such that they cannot ignite an explosive atmosphere in the environment 15 of housing 10.

The inner pressure relief device 23 and the outer pressure relief device 22 can be arranged on one side of housing 10 such that gas first flows through the inner pressure relief device 23 in order to then flow through the outer pressure relief device 22 in the environment 15 of housing 10.

The inner pressure relief device 23 and/or the outer pressure relief device 22 preferably ensure reduction of the peak pressure for the construction of housing 10 to an overpressure of less or equal to 1000 mbar or preferably less or equal to 500 mbar.

Wall 12 of first housing part 11 that two-dimensionally limits interior 14 of housing 10 from the top, from the bottom and/or from the side comprises a section 13 as first section 13 projecting transversely, e.g. orthogonal, outwardly (as illustrated) and/or (in sections) inwardly that forms a flange section. The flange section 13 surrounds the opening 17. The flange section 13 can be closed in circumferential direction. The flange section 13 comprises a bead 25. The bottom 26 thereof can project toward the side of the first housing part 11 opposite the opening 17 or in the opposite direction. The bead 25 surrounds the opening 17 preferably in a circumferential closed manner.

The material of second housing part 18, preferably sheet material, is preferably free of flameproof open pores or gaps that would fluidically connect interior 14 of housing 10 with the environment 15. As apparent from FIG. 1c, housing 10 can in addition or as an alternative to the pressure relief device 23 and/or the outer pressure relief device 22, that are supported by first housing part 11, hold a further pressure relief opening 27a and a further outer pressure relief body 27b, that form a further outer pressure relief device 28 and/or further inner pressure relief devices (not illustrated). For example, they can be configured as described above with reference to the inner and/or outer pressure relief device 23, 22 of first housing part 11 and serve the same purpose. A pressure relief opening 27a in the second housing part 18 is part of the outer pressure relief device 28 that is closed by a pressure relief body 27b in a flameproof, but gas permeable manner.

The first housing part 11 and the second housing part 18 can consist of steel sheet or an aluminum sheet, for example. As an alternative, first housing part 11 and/or second housing part 18 can consist of plastic. Preferably, the edge section 20 and/or the flange section 13 are sheet sections. The thickness, e.g. the sheet thickness of flange section 13 and/or of edge section 20 can be less or equal to 5 mm, less or equal to 3 mm or less or equal to 2 mm. Housing 10 can have such low wall thicknesses without additional measures for stabilization due to the outer pressure relief device 22, 28 and/or inner pressure relief device 23 that limits the explosion pressure so remarkably, such that even a housing 10 of a metal and/or plastic material having sheet thicknesses can withstand the explosion pressure.

As can be further derived from FIG. 1c, second housing part 18 comprises a further bead 29 closed in circumferential direction in the edge section 20 that forms a second wall section of second housing part 18. The bead 25 and the further bead 29 form a seat-back-pair, as apparent from FIG. 2. Thereby the dome that is here formed by the further bead 29 is located in a seat 30 formed by the bead 25 of first housing part 11.

FIG. 2 shows first housing part 11 and second housing part in abutment against one another in a non-clamped condition. Also in FIG. 1a housing 10 is illustrated in this condition without clamping device. As further apparent from FIG. 2, a support region 31 is defined for the first section 13 and the second section 20 in which the edge section 20 of second housing part 18 is supported on flange section 13 of first housing part 11, if second housing part 18 is placed on first housing part 11 (as shown in FIG. 1a and FIG. 2). First housing part 11 and second housing part 18 are not clamped with one another, as in the housing 10 being in flameproof condition. As illustrated in FIG. 2, the shapes of edge section 20 and flange section 13 are not complementary to one another. Rather from the support region 31 a gap-shaped intermediate region 32 opens in direction away from the support region 31. The intermediate region 32 is limited by the opposed first face 33 of first section 13 and second face 34 of second section 20. In a clamping region 35 that could also be denoted as force-introducing or pressing region and that is defined for the flange section 13 and the edge section 20, the sheet material of first housing part 11 and the sheet material of second housing part 18 are distant from one another. The intermediate region 32 forms a separation location of housing 10.

It has to be noted here that intermediate region 32 can be filled entirely or partly or can be void. The entirely or partly filled intermediate region 32 can be, for example, filled with a plastic element.

Figure 3:
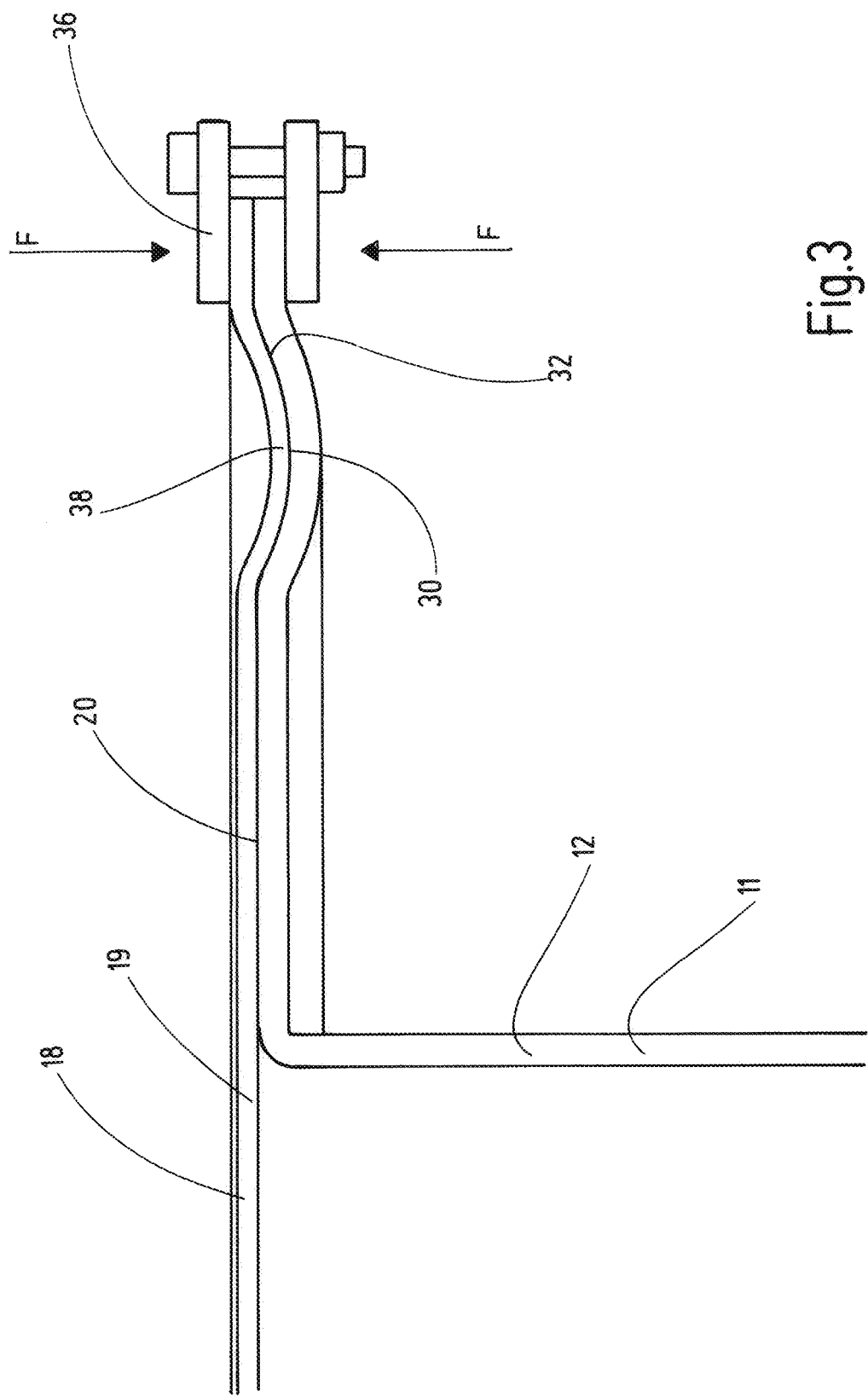
Figure 4:
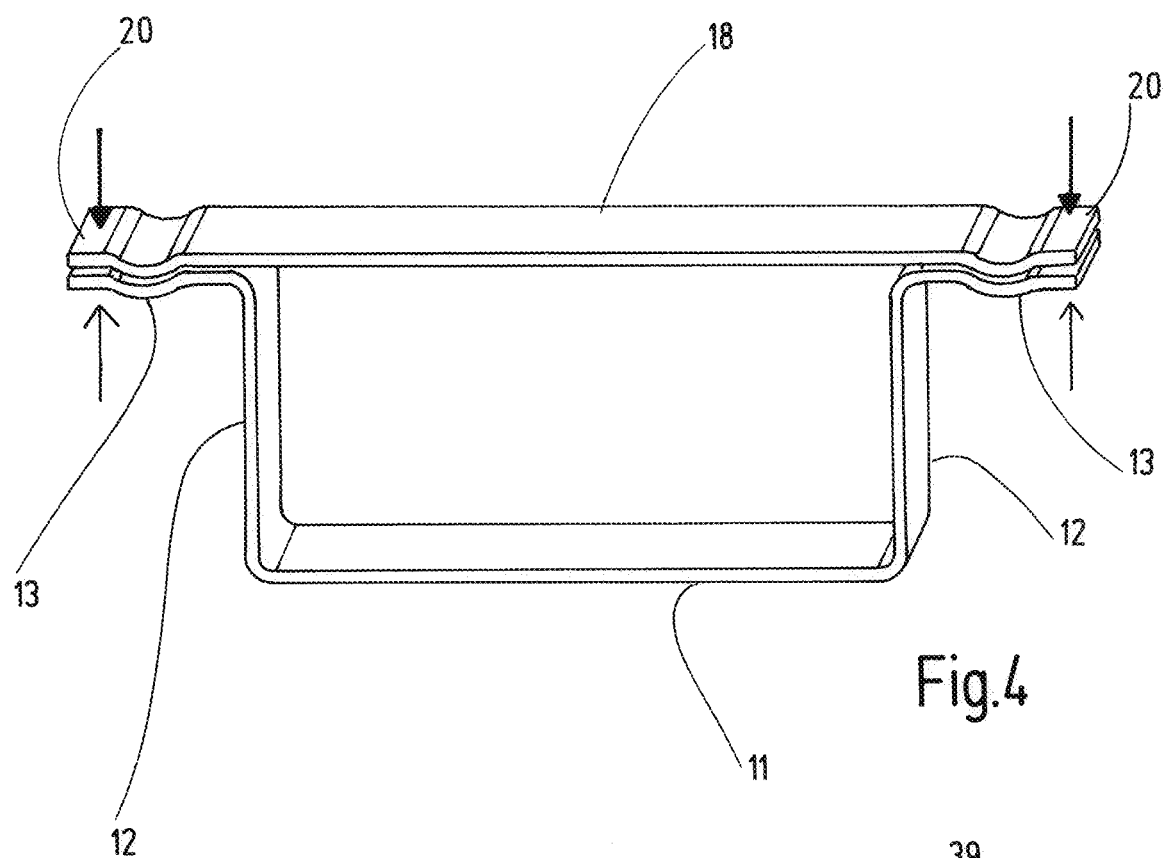

The edge section 20 of second housing part 18 and the flange section 13 of first housing part 11 being not clamped against one another, inspite of the abutment, the intermediate region 32 does not comprise a geometry yet, particularly length and/or maximum width, such that it would be flameproof. In order to close the opening 17 in a flameproof manner by second housing part 18, edge section 20 and flange section 13 have to be clamped with each other. A clamping device 36 serves for this purpose, as it is illustrated in FIG. 3 by way of example. The figure shows a part of the housing according to FIG. 1a. It is apparent from FIG. 4 that due to the clamping device 36, edge regions of edge section 20 and flange section 13 being clamping sections, are pressed against one another in order to close the intermediate region 32 in a flameproof manner. Due to the low material thickness of edge section 20 and flange section 13, low forces are already sufficient for clamping in order to deform the edge section 20 and flange section 13 such that the intermediate region 32 is narrowed by the deformation of flange section 13 and/or edge section 20, such that the intermediate region 32 has a gap geometry in the clamped condition that is flameproof. By the deformation of edge section 20 and/or the deformation of flange section 13, a 0-Ex-gap (explosion-proof gap of gap width 0) can be formed.

Figure 5:
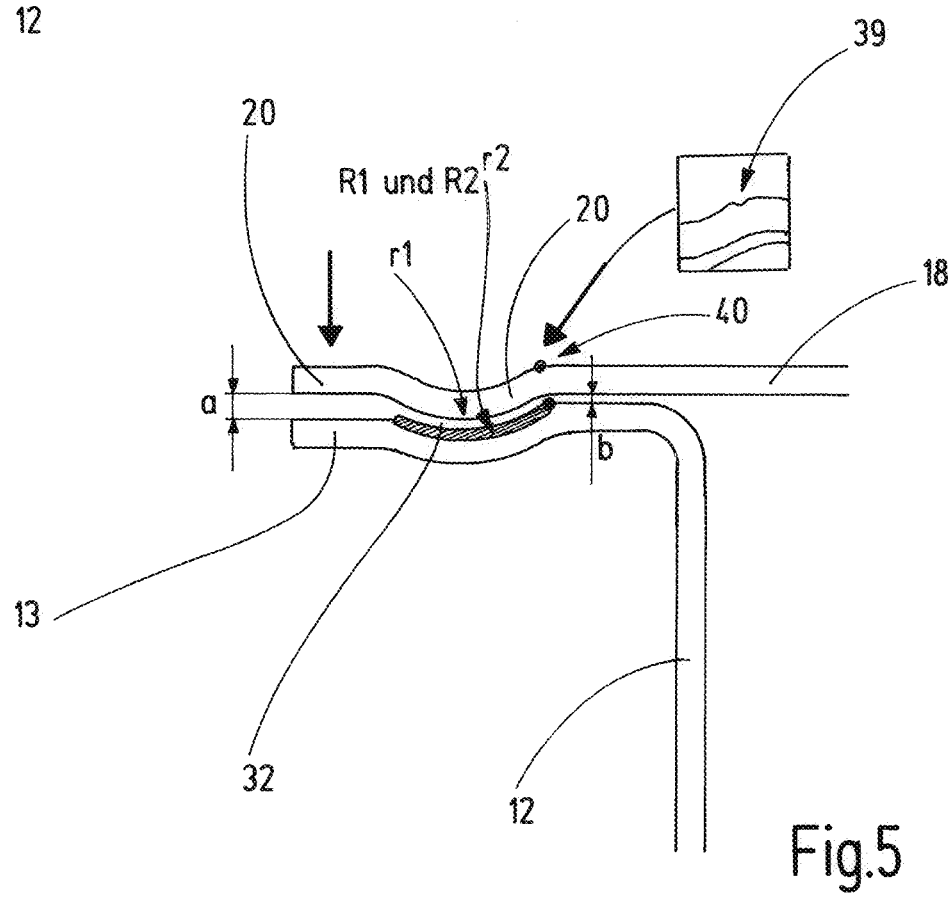

FIG. 5 is a more detailed illustration of exemplary geometric conditions in the housing 10 according to the invention. If second housing part 18 (preferably a sheet part) and first housing part 11 (preferably a sheet part) are brought into abutment, but are not yet clamped, the distance b between the sheet section of first housing part 11 and the sheet section of second housing part 18 in the intermediate region 32 and the interior 14 of housing 10 in the support region can be equal to 0 or partly greater than 0. A distance b greater 0 can be present along the edge of first housing part 11 in sections due to a predefined shape of second housing part 18 deviating from the shape of first housing part 11.

The intermediate region 32 can enlarge away from support region 31 up to a width a (a being greater than b). The radius of the round back 38 forming the edge section 20 can be r1, whereby the radius of seat 30 can be, for example, r2 and r1 being less than r2. Due to clamping of first housing part 11 and second housing part 18 to each other by means of force introduction in an introduction region 35 distant to the support region 31, the shapes, particularly the radii of edge section 20 and flange section 13 are adapted to one another. They need not to be equal thereafter, however the radii r1, r2 are converged to one another without necessarily having to be equal. In embodiments the radii r1, r2 can be converged such that they are equal in the clamped condition.

First housing part 11 and/or second housing part 18 can have a device 39 in order to define a bending zone 40 of first housing part 11 and/or second housing part 18. In the embodiment illustrated in FIG. 5 the device 39 consists, for example, in a cavity in the second housing part 18 in the periphery of bead 29. The trough-shaped cavity 39 can extend in circumferential direction in a closed or interrupted manner, e.g. along a straight line. A higher flexibility in the bending zone 40 can be defined alternatively or additionally to a reduced wall thickness due to a cavity by a structural change in a region of the sheet material (not illustrated), for example. Particularly, if a device 39 for defining a bending zone 40 is provided in second section 20 and/or first section 13, shape changes during clamping can be particularly exactly predefined. The material, particularly sheet material of first section 13 and/or second section 20, can be configured by means of such a device 39 specifically strong enough on one hand in order to be able to withstand an explosion and flexible enough on the other hand in order to keep the expenditure or force for deformation small for creation of the flameproof intermediate region 32.

In FIG. 5 the region that is closed during clamping such that it complies with the requirements of an Ex-gap is marked by a thicker line.

FIGS. 6a and 6b illustrate a further embodiment of the invention. The shape and/or position of the first face 33 of first section 13 and the shape and/or position of second face 34 of second section 20 are determined to form an intermediate region 32, if first housing part 11 and second housing part 18 are assembled in order to close the housing 10. The intermediate region 32 comprises a gap dimension outside of a flameproof range without sufficient clamping of first housing part 11 and second housing part 18. The first housing part 11 and the second housing part 18 are consequently configured and determined to limit an intermediate region at the separation location—if they are assembled as predetermined, but not clamped—that only takes flameproof gap dimensions due to the clamping and the deformation of first housing part 11 and/or second housing part 18 resulting therefrom. In the embodiment illustrated in FIG. 6a, 6b, 6c the beads are bead-shaped. These figures show another example in which the deformed first section 13 and/or the deformed second section 20 comprise a bend and/or a curvature 25, 29.

The bend and/or curvature 25, 29 forms preferably a longitudinal groove shape that extends transverse to the relevant (effective) length $L_{eff}$ of intermediate region 32. The relevant length $L_{eff}$ of intermediate region 32 is measured from inlet 41 of intermediate region 32 to outlet 42 of intermediate region 32. The length $L_{straight}$ of intermediate region 32 measured in straight direction from inlet 42 of intermediate region 32 to outlet 42 of intermediate region 32 can be much shorter than the effective length $L_{eff}$ of intermediate region 32 due to the bend or curvature. The effective length $L_{eff}$ of intermediate region 32 defines the flameproof resistance or flameproof condition of intermediate region 32. Thereby it is assumed that if gas travels along a path through the intermediate region 32 corresponding to the effective length $L_{eff}$, it is cooled down sufficiently that an explosion at the outlet 42 of intermediate region 32 can no longer be initiated.

Small wall thicknesses allow the use of sheet constructions and sheet techniques. Due to shaping of sheet elements, sheet pairs can be formed as first and second sections by means of known sheet-forming methods, such as deep drawing, metal spinning, rolling, beading, bending, high-pressure forming, stretch-forming, spinning, drawing, laser beam bending, etc., which can be deformable in the elastic range of the sheet material and that limit a sheet material formed gap geometry of the intermediate region. The two sheet sections limiting the intermediate region can be deformed by clamping in such a manner that the intermediate region is closed to an Ex-gap. This does not mean that the intermediate region is gas-tight, but that no gases or particles can exit the intermediate region, so hot that they could ignite an atmosphere outside of housing 10.

FIGS. 6a to 6c and 7 show embodiments in which first housing part 11 and second housing part 18 comprise V-shapes that are non-complementary to each other, such that the sheet material formed gap geometry is also V-shaped. The wall face 33 of sheet section 13 of first housing part 11 and sheet section 20 of second housing part 18 that are opposite to one another and limit the intermediate region 32 therebetween, confine different angles $\alpha 1$, $\alpha 2$. In the embodiment according to FIGS. 6a and 6b, the outer face 34 of a back-shaped section 20 of second housing part 18 is V-shaped in cross-section and defines a smaller opening angle $\alpha 2$ than the wall face 33 of sheet section 13 of first housing part 11 that limits the longitudinal seat 30. Thereby a support region 31 is defined on the bottom of the longitudinal seat 30. At the free ends of the sheet sections 13, 20 the distance between first housing part (distance a) is (in the non-clamped abutment) longer than in the support region 31. Therefore the intermediate region 32 opens increasingly outwardly. In the support region 31 the distance (b) can be, for example, 0 or greater than 0 in case an intermediate element is arranged between first sheet section 13 or first housing part 11 and sheet section 20 of second housing part 18. Also the distance in the non-clamped condition can be partly larger than 0, if the first housing part 11 and the second housing part 18, due to rough manufacturing tolerances, are only in punctual abutment in the non-clamped condition.

The opening angle $\alpha 1$ of the receiving bead 25 is larger than the opening angle $\alpha 2$ that is defined by sheet section 20 of second sheet part 18 facing the first sheet part 11. As indicated by arrows, force introduction regions inside and outside of the circumference defined by the intermediate region 32 are defined. Thereby sub-sections of the sheet sections 13, 20 can be pressed in opposite direction against the counter-sections 13, 20. Non-clamped abutment or non-clamped condition means that the first section 13 and the second section 20 are not yet pressed against one another closing the intermediate region 32 in a flameproof manner.

As can be seen in FIG. 6b, the sheet thickness of first housing part 11 is greater than the sheet thickness of second housing part 18. During clamping the shapes of the beads adapt to one another such that the difference in the angles $\alpha 1$, $\alpha 2$ of the faces 33, 34 of first sheet part 11 and second sheet part 18 facing toward one another is less in the clamped condition than in the non-clamped condition. Due to the different sheet thicknesses from which a different flexibility results, parts of the second section 20 of second housing part 18 travel a longer portion of the path S that has to be travelled for flameproof deformation, compared with parts of the first section 13 of first housing part 11.

The path S that a first housing part 11 and the second housing part 18 have to travel toward one another at least partly in order to close the intermediate region 32 down to zero, or at least so far that flameproof condition is established, is illustrated in FIG. 6c. The path S can be predominantly (more than half) travelled by second housing part 18 or first housing part 11 depending on which housing part 11, 18 is more flexible respectively, due to the sheet thickness, the material, the structure, the shape and/or other characteristics.

Due to the different opening angles $\alpha 1$, $\alpha 2$, intermediate region 32 opens increasingly inwardly from the bottom of seat 30. Inside of the circumference defined by seat 30 and/or intermediate region 32 the distance c of sheet section 13 of first housing part 11 and second housing part 18 can be approximately equal to the distance a (in case of abutment and in non-clamped condition).

Figure 7:
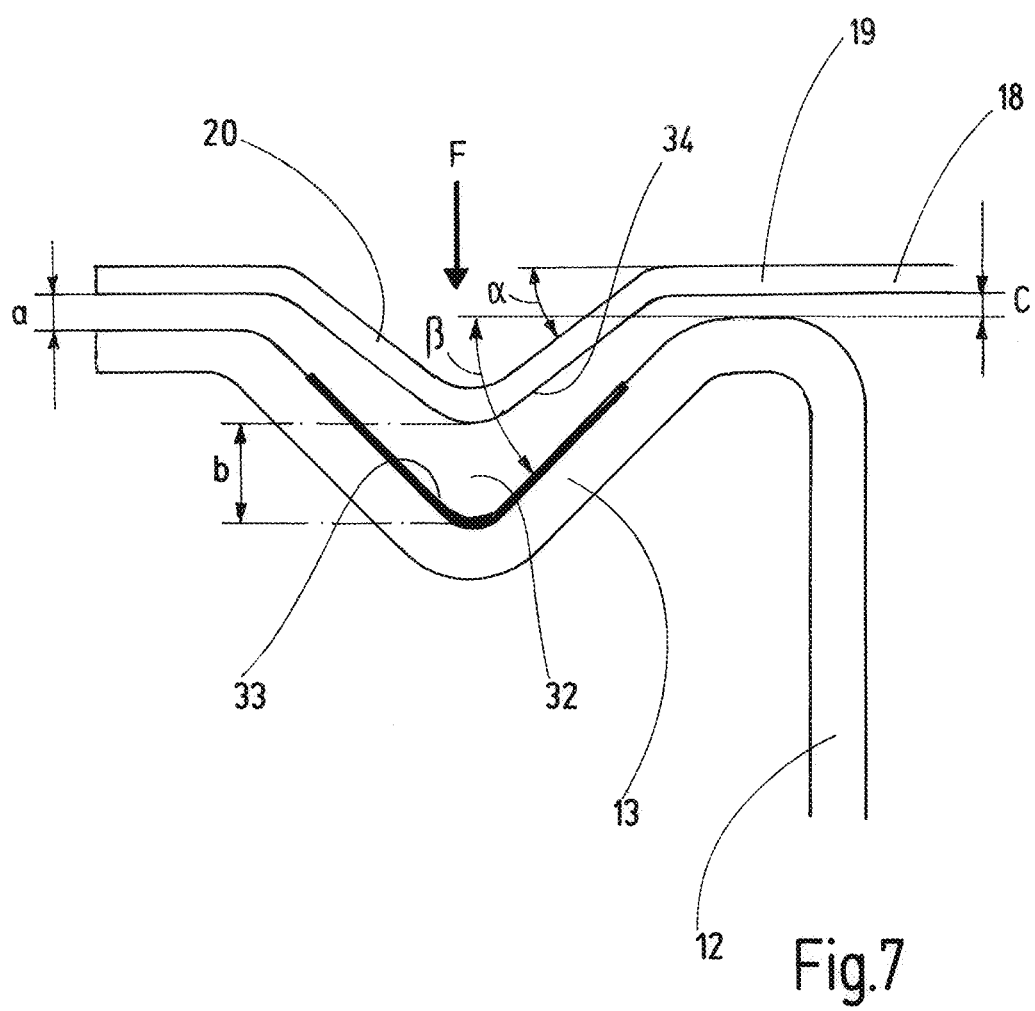

In the embodiment according to FIG. 7, face 34 of back region of sheet section 20 of second housing part 18 confines a larger opening angle $\alpha 2$ than the opposite face 33 of sheet section 13 of first housing part 11. The distance b between the tip 43 of the back and bottom 26 of longitudinal cavity 25 is larger than the distance a, c of sheet section 13 of first housing part 11 and sheet section 20 of second housing part 18 inside and/or outside of the circumference that is defined by means of tip 43 of back 38. It preferably applies b>a and a>c.

The arrows in FIGS. 6a, 6b and 7 indicate examples of possible force application locations for clamping of first housing part 11 and second housing part 18, such that the intermediate region 32 between the sheet section 13 of first housing part 11 and the sheet section 20 of second housing part 18 is closed by means of the clamping and the accompanying elastical deformation of sheet section 13 of first housing part 11 and sheet section 13 of second housing part 20.

In embodiments according to FIG. 7, the intermediate region 32 opens increasingly from inside to outside in the non-clamped condition, but in abutment of second housing part 18 and first housing part 11 suitable for clamping toward bottom 26 of seat 25 and from outside to inside toward bottom 26 of seat 25. A path S for closing the intermediate region 32, such that it is flameproof, is predominantly travelled by frame section 20 of second housing part 18 due to the smaller thickness of the material of second housing part 18 that is more flexible than the flange section 13 due to its smaller thickness.

Figure 8A:
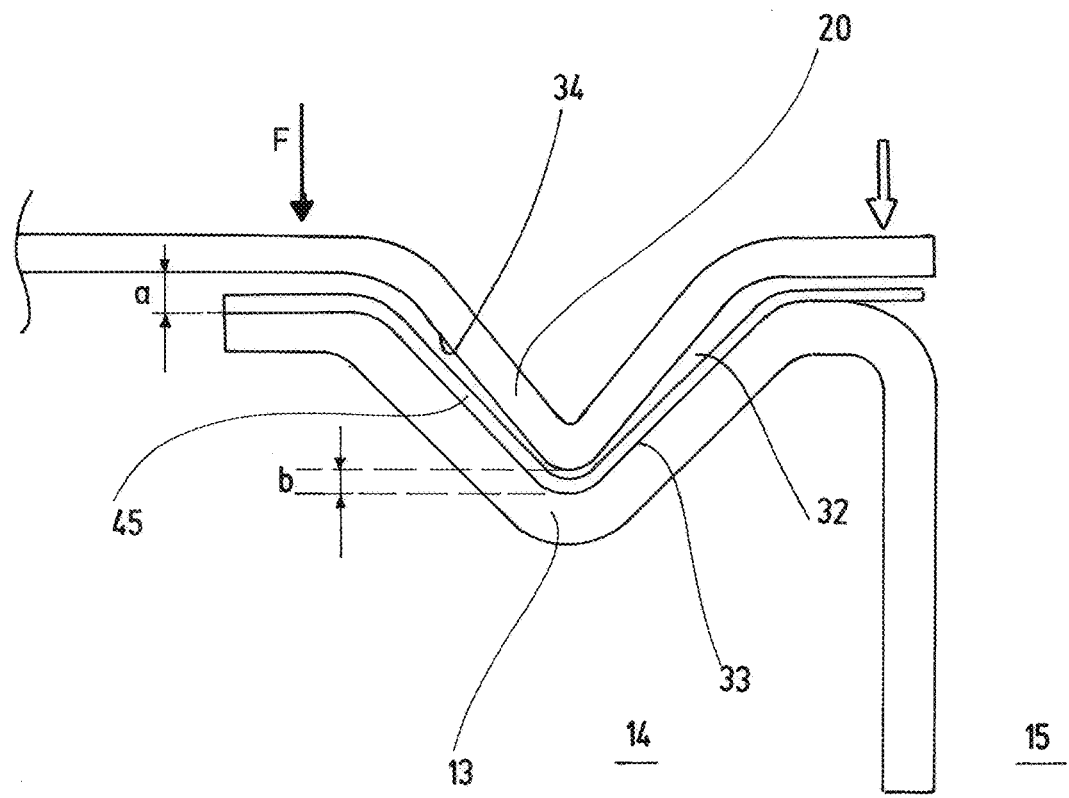
Figure 8B:
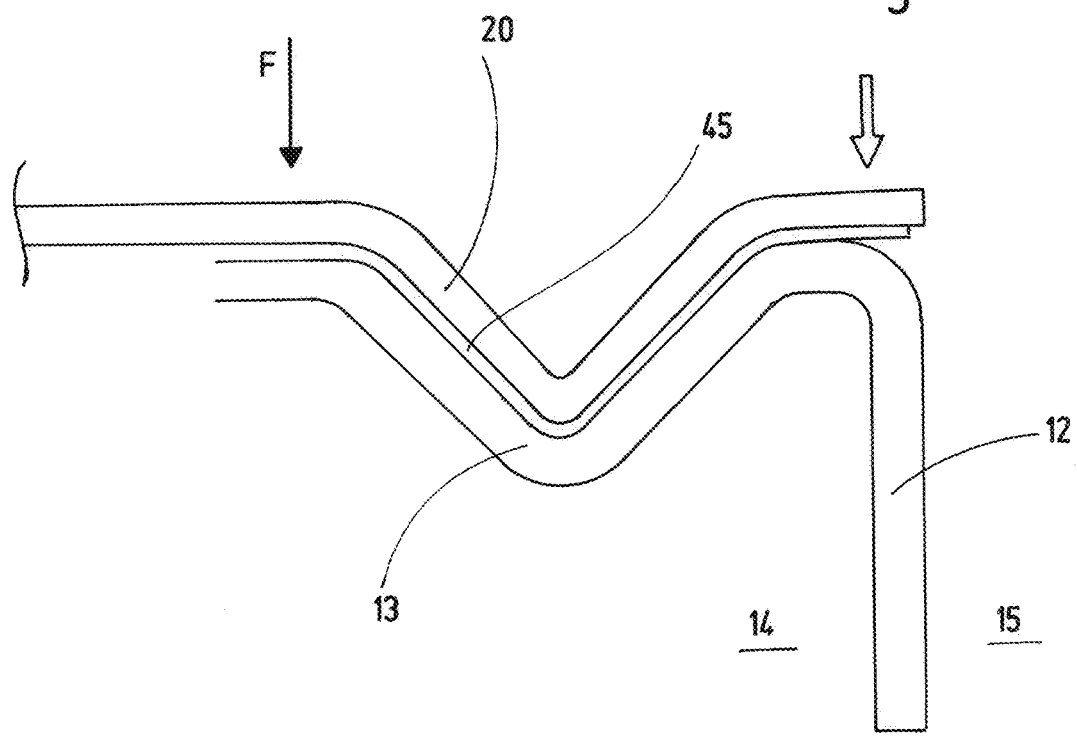

FIGS. 8a to 8b show an embodiment having a first housing part 11 and a flange section 13 that is a section of first housing part 11 projecting inwardly. Flange section 13 forms a longitudinal seat 30 that can be V- or U-shaped, for example. Second housing part 18 forms a back 38 that is arranged inside seat 30 in the non-clamped condition and especially in the clamped condition, if first housing part 11 and second housing part 18 abut against each other in order to be clamped or in the clamped condition. Between sheet section 13 of first housing part 11 and sheet section 20 of second housing part 18 an intermediate frame 45 is arranged such that the first section 13 of first housing part 11 and second section 20 of second housing part 18 do not abut directly, but via intermediate frame 45. The intermediate frame 45 is a part separate from the first housing part 11 and the second housing part 18, however, can be connected with first housing part 11 or second housing part 18, particularly adhesively connected. The intermediate frame 45 can consist of plastic, while first housing part 11 and second housing part 18 can consist of the same plastic, of another plastic or of metal. The elastic deformability of intermediate frame 45 can be larger than the deformability of sheet section 13 of first housing part 11 and second housing part 18, that face one another. If the sheet section 13 of first housing part 11 and sheet section 20 of second housing part 18 are clamped with each other, the shape of first sheet section 13 of first housing part 11 and the shape of second sheet section 20 of second housing part 18 approach each other due to elastic deformation of first housing part 11 and/or the sheet section 20 of second housing part 18. Also in the clamped condition the shape of sheet section 13 of first housing part 11 and sheet section 20 of second housing part 18 does not have to be complementary necessarily. The elastically flexible intermediate frame 45 can support the flameproof closing of the deformation of the second section 20 and/or first section 13 in that the deformation of the intermediate frame 45 fills interstice and thus contributes to an overall flameproof intermediate region 32.

Figure 9A:
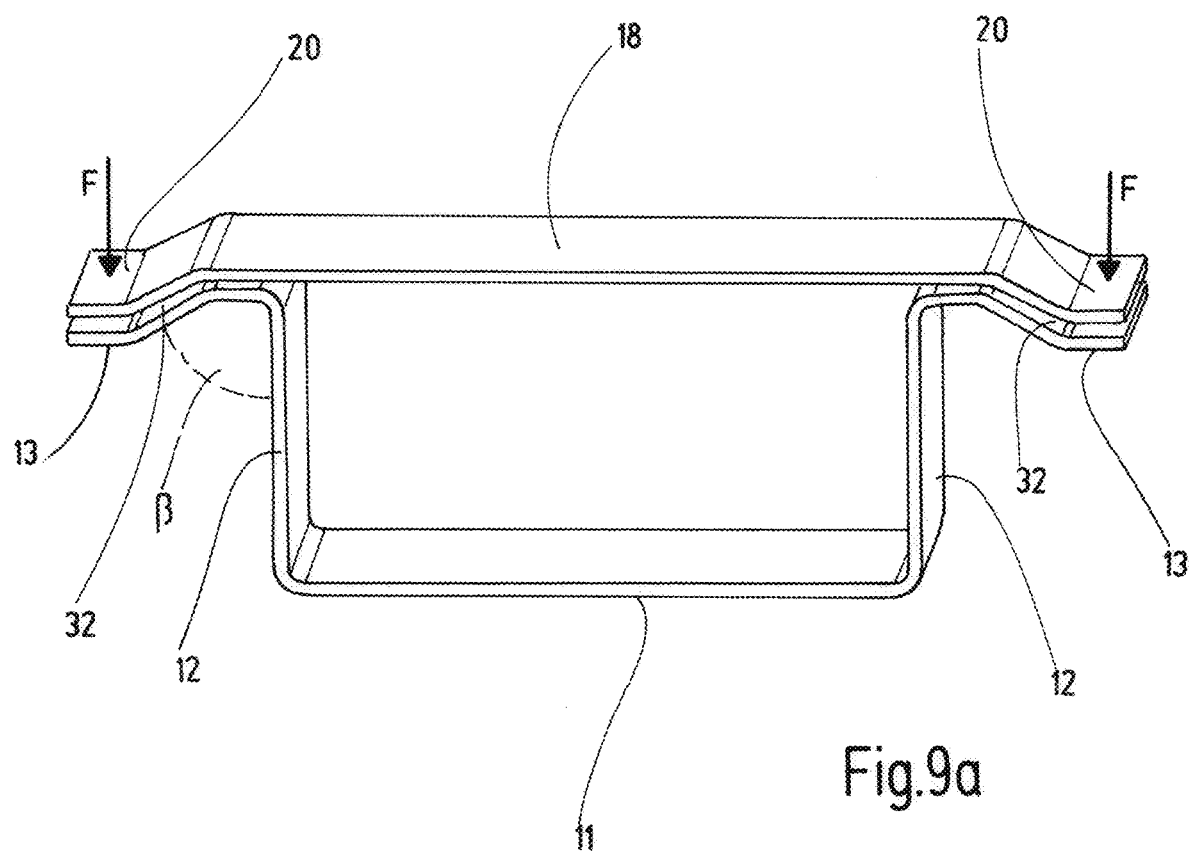
Figure 9B:
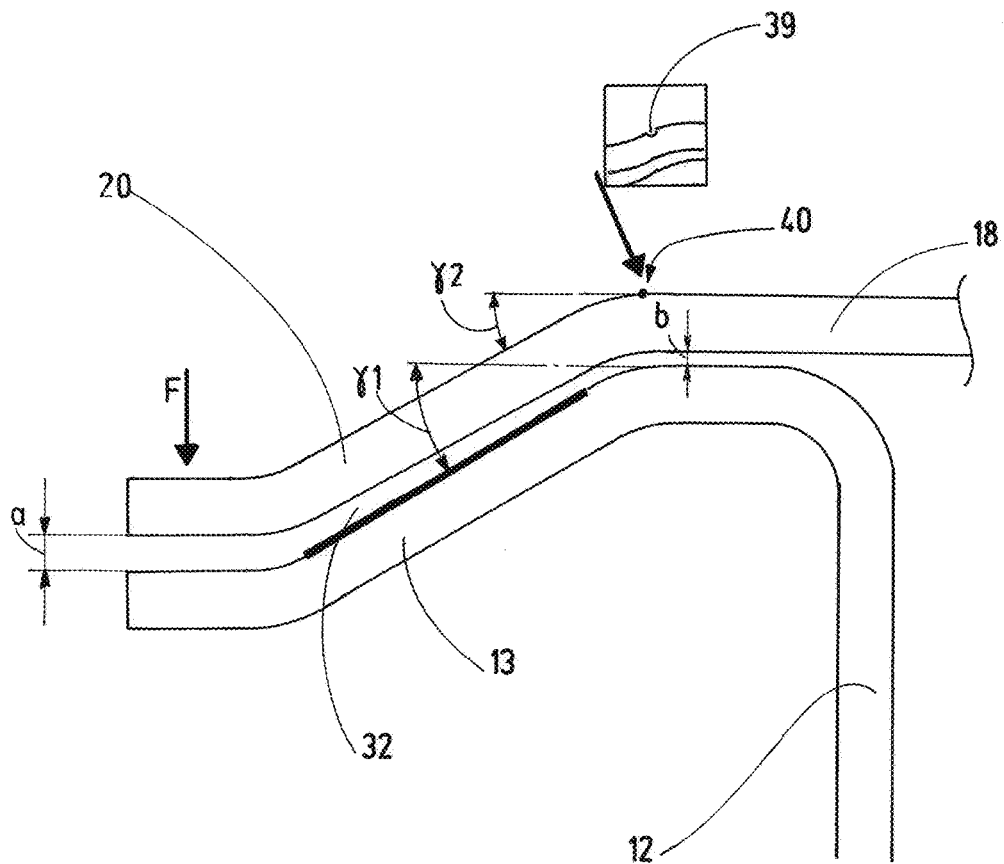

A further embodiment of desired shapes of sheet section 30, 20 of a first housing part 11 and a second housing part 18 of a housing 10 according to the invention that are non-complementary to each other in the non-clamped condition during abutment are illustrated in FIGS. 9a and 9b. FIG. 9a shows a part of an explosion-proof housing 10 according to the invention between two parallel cutting planes. At least a sub-section of the sheet section 13 of first housing part 11 and at least a sub-section of sheet section 20 of second housing part 18 confines an angle β less than 90° with the wall 12 of housing 10. The free end of the sheet section 13 of first housing part 11 and the sheet section 20 of second housing part 18 that form bending springs in order to close an intermediate region 32 therebetween during clamping in a flameproof manner is arranged between the opening plane and the opposite backward or bottom plane of housing 10.

The embodiment according to FIGS. 9a, 9b is realized without trough-shaped and/or longitudinal cavity 30 and respective domes 38 that can be back-shaped, for example. However, modifications of the embodiment according to FIGS. 9a, 9b are possible in which the first sheet section 13 and/or the second sheet section 20 is configured with a cavity 30, particularly trough and/or longitudinal cavity in which a dome 38, particularly a back of the other sheet section 20 is arranged. While examples are shown in which first housing part 11 forms the seat 30 and the second housing part 18 forms the back, in addition or as an alternative, first housing part 11 can form the back 38 and the second housing part 18 can form the seat 30.

In the embodiment illustrated in FIGS. 9a, 9b in abutment (distance b greater or equal to 0) of second housing part 18 on first housing part 11 (directly or via (not illustrated) an intermediate element 45) the intermediate region 32 opens increasingly in a wedge-shaped manner due to different angles γ1, γ2 of second section 20 and first section 13 relative to a reference plane toward the free end of section 13 of first housing part 11 and section 20 of second housing part 18. The sheet section 13 of first housing part 11 and/or sheet section 20 of second housing part 18 can have a device 39 for defining a bending zone 40. For example, device 39 can consist in a notch in section of the first housing part 11 and/or a notch in the section of the second housing part 18. Other possibilities are a structural change, e.g. due to heating and/or deforming.

An intermediate region 32 is formed between second section 20 and first section 13 having a wedge gap shape that is narrowed due to clamping in order to close it in flameproof manner. In case of an abutment due to a shape of first housing part 11 and second housing part 18, as shown in FIGS. 9a, 9b, in which a smaller distance between the sections is present on the inside than on the outside, the force during clamping is distributed such that the largest contact force is applied on the inside in order to avoid widening at this location due to an explosion.

Figure 9C:
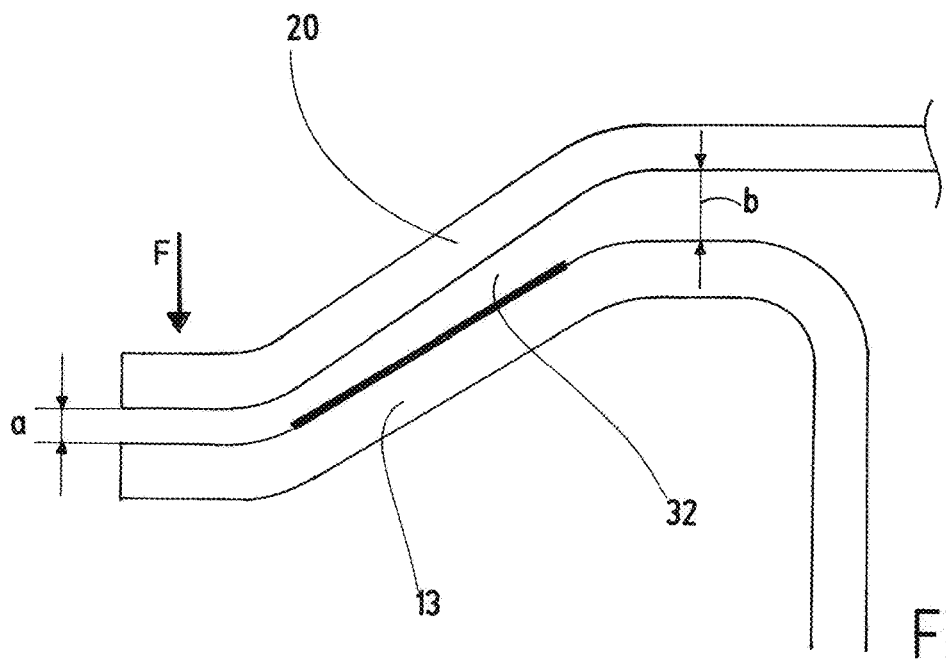

FIG. 9c shows a modification of the example according to FIGS. 9a, 9b. In this modification the intermediate region 32 widens from outside to inside (b>a).

Figure 10A:
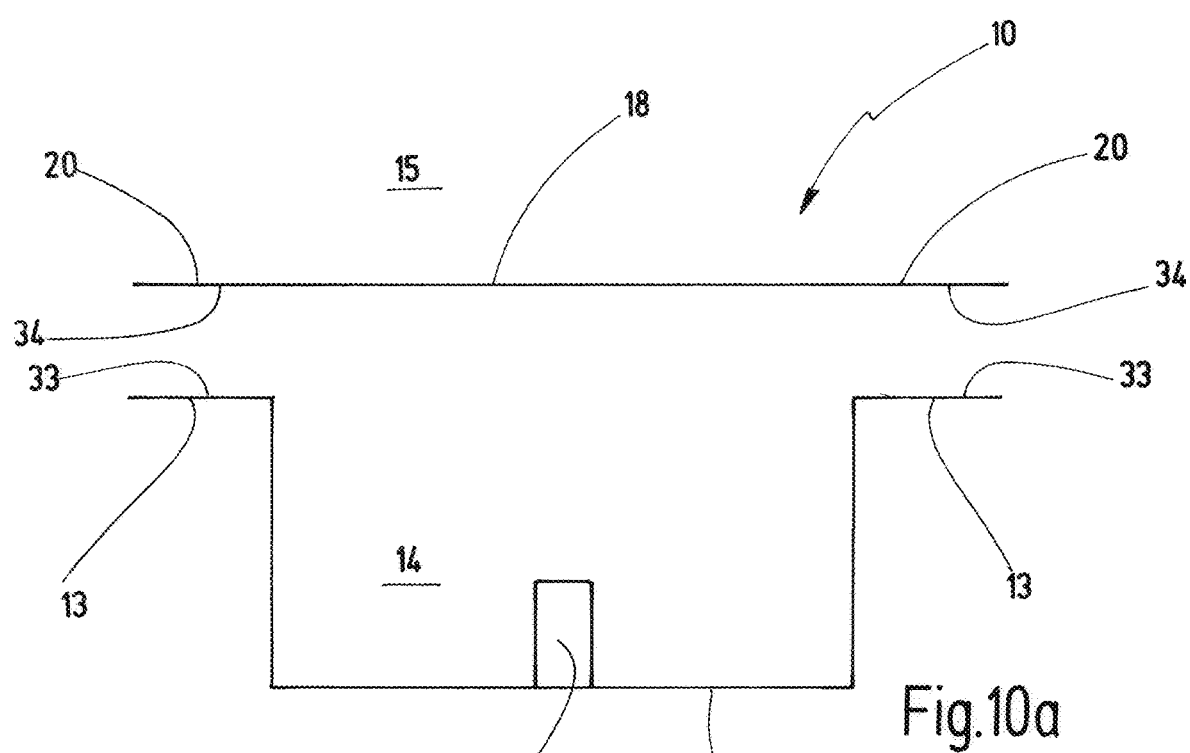
Figure 10B:
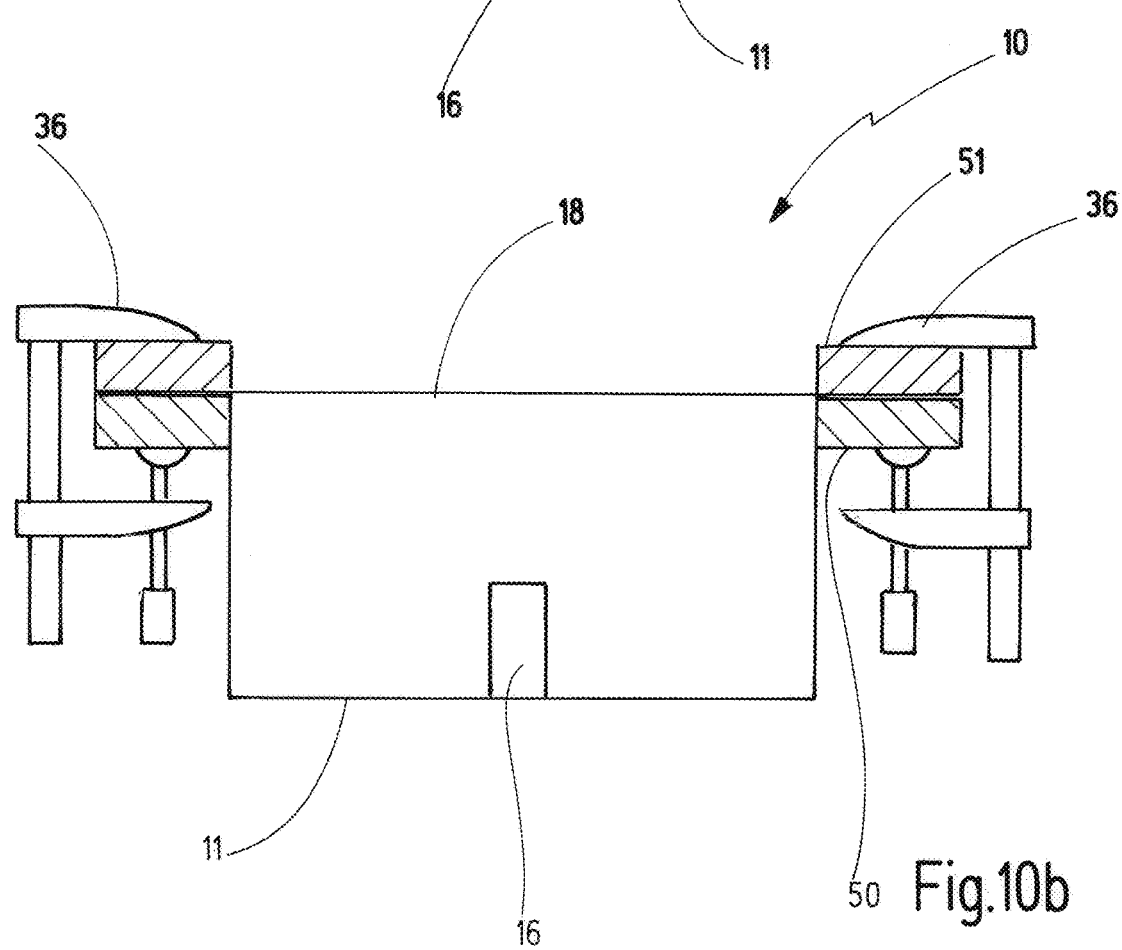

FIGS. 10a and 10b shown an embodiment of a housing 10 according to the invention in which flange section 13 of first housing part 11 and counter section 20 (a virtually frame-shaped section) of second housing part 18 comprise complementary desired shapes. In the illustrated embodiment first section 13 and second section 20 have planar complementary desired shapes. First section 13 and second section 20 are, however, manufactured with tolerances that are so rough that the intermediate region 32 between first housing part 11 and second housing part 18 is closed in a flameproof manner only after elastic deformation of first section 13 and/or second section 18 due to clamping. An abutment of second housing part 18 on first housing part 11 without clamping does not reliably result in a geometry of intermediate region 32 that is flameproof. First section 13 of first housing part 11 and second section 20 of second housing part 18 can comprise a wall thickness of maximum 5 mm, preferably maximum 3 mm, particularly preferably maximum 2 mm. With such a small wall thickness already a small force application is sufficient during clamping in order to result in a deformation by which intermediate region 32 is closed in a flameproof manner. As in other embodiments, also first section 13 and/or second section 20 can consist of metal sheet, particularly steel sheet or aluminum sheet or of plastic.

FIG. 10b shows the housing parts clamped against one another. For this a clamping device 36 is used. The clamping device 36 can comprise a first block 50, being for example frame-shaped, and a second block 51, being for example frame-shaped, that are pressed against one another by means of clamps in order to press the frame section 20 and the flange section 13 against one another therebetween. Due to the force application, a flameproof separation location 32 is obtained that does not let out gas and/or particles, also in case of an explosion in the interior 14 of housing 10 being so hot that it would be suitable for ignition of the environment 15. The intermediate region 32 between first housing part 11 and second housing part 18 is closed up to a flameproof gap, e.g. a 0-gap.

In FIG. 10c on the left it is illustrated in a side view highly schematically that the first section 13 and/or the second section 20 can comprise a remarkable corrugation shape due to rough manufacturing tolerances. FIG. 10c shows a clamping device 36 being an alternative to FIG. 10b. In modification of the embodiment according to FIGS. 10a, 10b, first section 13 and second section 20 comprise cavities 52, 53, particularly holes in the embodiment according to FIG. 10c provided for passing bolts 54, particularly screws. The block or blocks 50, 51 comprise respective cavities 55, 56, particularly holes for location of bolts 54 that are guided through the cavities 52, 53 in first section 13 and second section 20. Block 50 and/or block 51 can particularly comprise threaded bores. FIG. 10c shows on the right in a cut view along a part of the circumference of first housing part 11 or second housing part 18 the clamping device 36 in clamped condition. Blocks 50, 51 press toward each other by means of a bolted connection 54 such that first section 13 and second section 20 are clamped with one another and thereby the intermediate region 32 is closed in a flameproof manner due to the elastic deformation of first section 13 and/or second section 20. The illustrated gap width between first section 13 and second section 20 that is partly different from zero emphasizes that the flameproof condition with sufficiently long length and small width of the gap-shaped intermediate region 32 is established, whereby these two dimensions are in relation to one another. Between the cavities 52, 53 in the first section 13 and the second section 20 for location of bolts 54 and the interior 14 of housing 10 sufficient distance exists, such that the intermediate region 32 measured from the interior 14 to the cavities 52, 53 has a sufficient length for the flameproof condition.

Figure 11A:
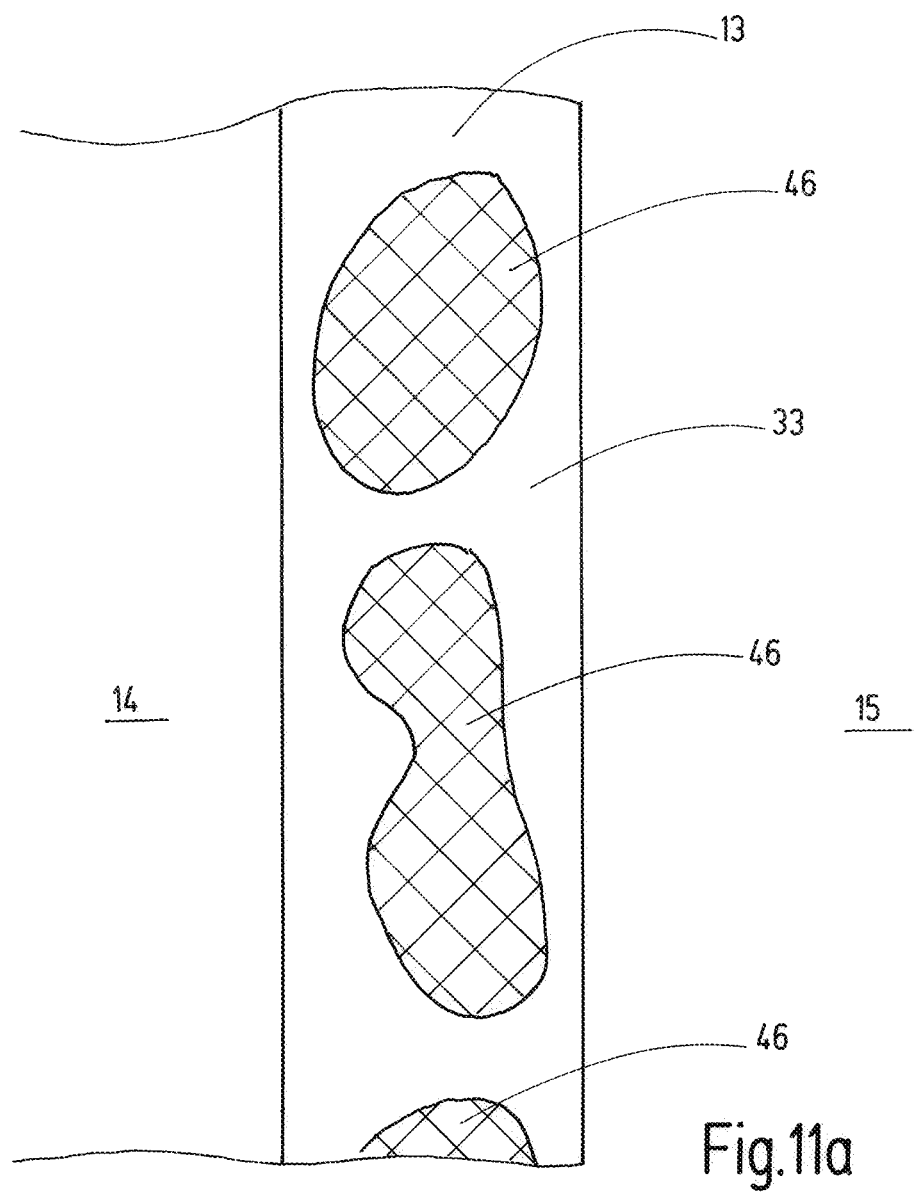
Figure 11B:
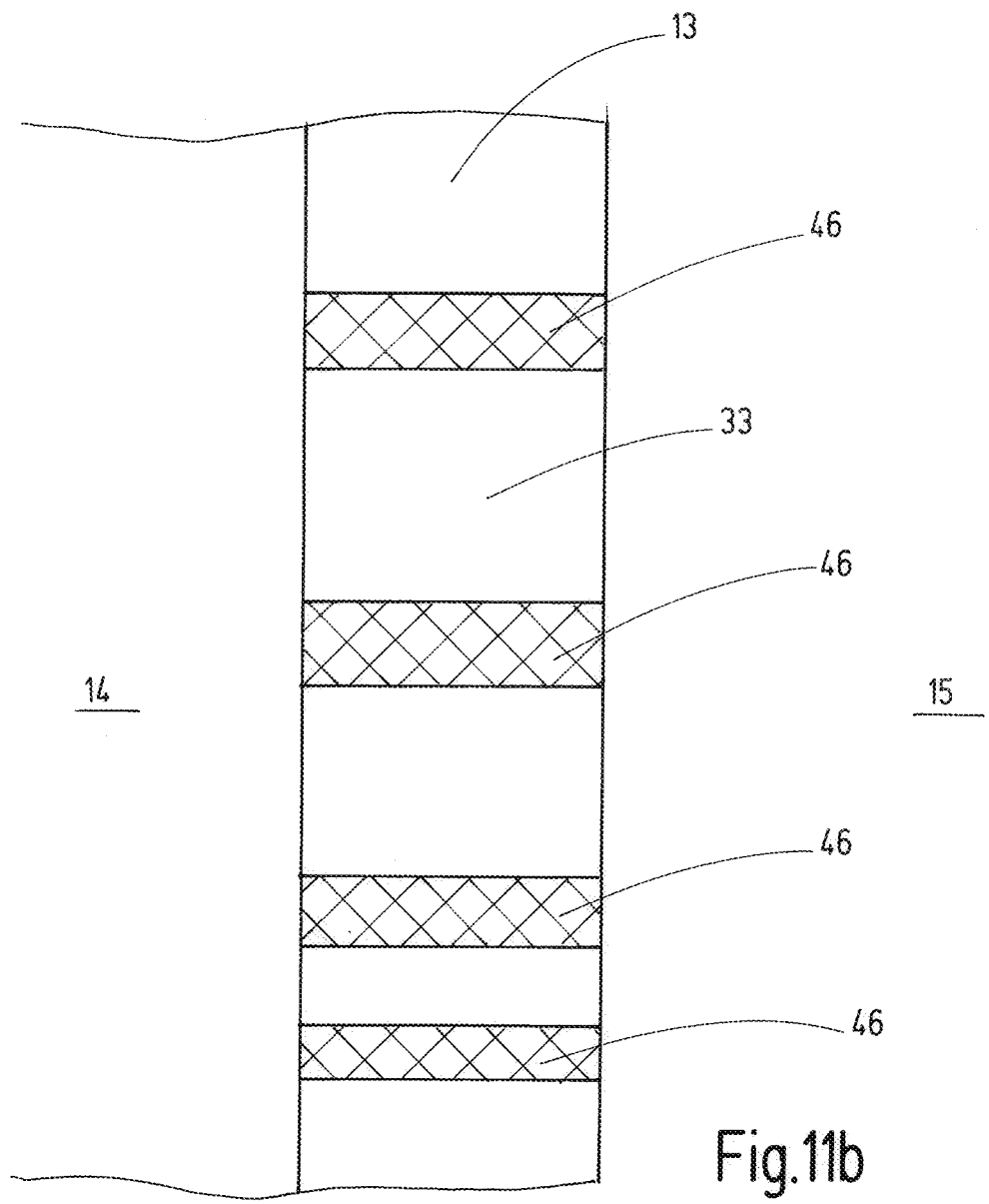

FIG. 11a shows an exemplary view on face 33 of section 13 of first housing part 11 of FIGS. 10a and 10b. FIG. 11b shows another example. Such regions 46 in which face 34 of second section 13 of second housing part 18 already abuts randomly against first housing part 11 in the non-clamped condition are illustrated in a hatched manner. These regions 46 are of arbitrary size and shape, e.g. island-shaped and/or strip-shaped and are randomly distributed over the face 33 of first housing part 11. The geometry of the intermediate region 32 through a region 46 and/or between two regions 46 is not flameproof in the unclamped condition. As already explained in connection with FIGS. 10a and 10b, intermediate region 32 is only geometrically narrowed in such a manner that it is flameproof after elastic deformation.

FIGS. 12, 13 illustrate examples of methods 100, 200 according to the invention. By way of example FIG. 12 illustrates a method 100 for manufacturing a housing 10, e.g. a housing 10 as described above in connection with FIGS. 1-11c. The method comprises selecting 101 of a first section 13 and a second section 20 for limitation of an intermediate region 32 of housing 10, whereby at least one of the sections 13, 20 is a wall section. First section 13 and second section 20 are selected such that first section 13 and second section 20 can be pressed against one another by means of a clamping device 36 under elastic deformation of wall section 13, 20, such that the intermediate region 32 is geometrically closed in a flameproof manner due to the elastic deformation of the wall sections 13, 20. First section 13 and second section 20 are selected in terms of shape, wall thickness, material, elasticity module and the like in a coordinated manner, such that the intermediate region 32 can be geometrically closed in a flameproof manner.

In embodiments in which the first section 13 and the second section 20 are sheet sections respectively, an intermediate region 32 is formed due to the abutment having an elastically adjustable sheet gap geometry that is geometrically narrowed due to the deformation of the at least one wall section 13, 20 in order to close it in flameproof manner.

FIG. 13 illustrates a method 200 for manufacturing an explosion-proof connection between a first section 13 or first housing part 11 with a first face 32 and a second section 20 of second housing part 18 with a second face 34 of a housing 10, as it has been described, for example, in relation to FIGS. 1-11c. At least one of the sections 13, 20 is a wall section. The method 200 comprises the assembly 201 of first housing part 11 and second housing part 18 in order to close the housing 10. With assembled first housing part 11 and second housing part 18 first face 33 and second face 34 limit an intermediate region 32 that comprises a gap dimension outside of a flameproof range. The sections 13, 20 are applied 202 with a force, wherein the sections 13, 20 are pressed against one another under elastic deformation of the at least one wall section 13, 20, such that the intermediate region 32 is geometrically closed in a flameproof manner due to the elastic deformation of wall section 13, 20. In embodiments first section 11 and second section 18 are deformed toward one another, wherein first section 11 and second section 18 travel different parts of path S required for flameproof closing depending on the elastic flexibility of the different sections. The deformation is geometrically used for closing the intermediate region 32.

Preferably the connection can be reestablished. For this the clamping is released 203 and the second housing part 18 is removed 204 from first housing part 11. Second housing part 18 and first housing part 11 can be brought in abutment for reestablishing 205 of the connection and the method according to FIG. 13 can be repeatedly applied.

An explosion-proof housing 10 is provided that forms an interior 14 for location of component 16 that can form ignition sources. The housing comprises a first housing part 11 having a first section 13 comprising a first face 33 and a second housing part 18 having a second section 20 comprising a second face 34, wherein the first section 13 and/or the second section 20 is a section of a wall 12, 19, wherein the first face 33 and the second face 34 limit an intermediate region 32. First section 13 and second section 20 are pressed against one another under elastic deformation of the wall section 13, 20, such that the intermediate region 32 is geometrically closed in a flameproof manner due to the elastic deformation of the wall section 13, 20. In addition, a method 200 for manufacturing an explosion-proof connection between a first section 13 of a first housing part 11 having a first face 33 and a second section 20 of a second housing part 18 having a second face 34 of a housing 10 is provided, wherein at least one of the sections is a section 13, 20 of a wall. Another method 200 for manufacturing of an explosion-proof connection between a first section 13 of a first housing part 11 having a first face 33 and a second section 20 of a second housing part 18 having a second face 34 of a housing 10 is provided, wherein at least one of the sections is a section 13, 20 of a wall 12, 19.

LIST OF REFERENCE SIGNS 10 housing
11 first housing part
12 wall
13 first section/wall section/flange section
14 interior
15 environment
16 components
17 opening
18 second housing part
19 wall
20 second section wall section/edge section
21a pressure relief opening
21b pressure relief body
22 outer pressure relief device
23 inner pressure relief device
24 porous material
25 bead
26 bottom
27a pressure relief opening
27b pressure relief body
28 outer pressure relief device
29 further bead
30 seat
31 support region
32 intermediate region
33 first face
34 second face
35 clamping region
36 clamping device 38 back
39 device
40 bending zone
41 inlet
42 outlet
43 tip
45 intermediate frame
46 region
50 block
51 block
52 cavity
53 cavity
54 bolt
55 cavity
56 cavity
100 method
101 selecting
200 method
201 assemble
202 apply
203 release of clamping
204 remove
205 reestablish the connection
r1 radius
r2 radius
$L_{eff}$
$L_{straight}$
α1 angle
α2 angle
B angle
S path

The invention claimed is:

1. An explosion-proof housing that forms an interior for location of components that can form ignition sources, the explosion-proof housing having a first housing part with a flange section that comprises a first face and a second housing part with a second section that comprises a second face, wherein the flange section and/or the second section is a wall section, and the first face has a first configuration and the second face has a second configuration that is different from the first configuration, such that the first configuration and the second configuration define an intermediate region therebetween when the first configuration and the second configuration are adjacent to each other, and wherein the flange section and the second section are pressed against one another after elastic deformation of the wall section, such that the intermediate region is geometrically closed in a flameproof manner due to the elastic deformation of the wall section, wherein the explosion-proof housing is configured according to an explosion protection category of flame-proof enclosure as defined by the standard (DIN EN 600-79/1) and the interior of the explosion-proof housing is configured to arrange electrical or electronic components therein that could form ignition sources; wherein the flange section is a sheet and/or the second section is a sheet section; wherein a sheet thickness of the flange section and/or the second section is no greater than a maximum of 5 mm.

2. The explosion-proof housing according to claim 1, wherein the flange section is part of the first housing part and the second section is part of the second housing part, wherein the flange section and the second section confine an angle in case of abutment of the first housing part on the second housing part in a non-clamped condition due to a geometric desired shape of the flange section and the second section.

3. The explosion-proof housing according to claim 1, wherein in abutment of the first housing part and the second housing part against one another in a non-clamped condition a width of the intermediate region increases from a support region in direction toward an environment of the housing and/or in a direction toward the interior due to a desired shape of the first housing part and the second housing part.

4. The explosion-proof housing according to claim 1, wherein the second section is supported on the flange section during flameproof closing of the intermediate region by elastic deformation in a defined support region directly or indirectly, wherein the defined support region forms an inner edge of the intermediate region and/or wherein the defined support region is arranged between an inner edge and an outer edge of the intermediate region.

5. The explosion-proof housing according to claim 1, wherein the flange section and/or the second section forms a longitudinal seat and wherein the second section and/or the flange section comprises at least one longitudinal dome that is located inside the seat.

6. The explosion-proof housing claim 1, wherein an elastically deformed intermediate element is arranged between the flange section and the second section via which the flange section and the second section are pressed against one another.

7. The explosion-proof housing according to claim 6, wherein the intermediate element is a frame.

8. The explosion-proof housing claim 1, wherein the first face of the flange section limiting the intermediate region and/or the second face of the second section limiting the intermediate region is orientated obliquely relative to a wall of the housing.

9. The explosion-proof housing according to claim 1, wherein the flange section and/or the second section comprises a device for defining a bending zone.

10. The explosion-proof housing according to claim 1, wherein the housing is reclosable.

11. The explosion-proof housing according to claim 1, wherein an inner pressure relief device and/or an outer pressure relief device is assigned to the housing.

12. A method for manufacturing an explosion-proof housing that forms an interior for location of components that can form ignition sources, the explosion-proof housing having a first housing part with a flange section that comprises a first face and a second housing part with a second section that comprises a second face, wherein the flange section and/or the second section is a wall section, and the first face has a first configuration and the second face has a second configuration that is different from the first configuration, such that the first configuration and the second configuration define an intermediate region therebetween when the first configuration and the second configuration are adjacent to each other, and the flange section and the second section are pressed against one another after elastic deformation of the wall section, such that the intermediate region is geometrically closed in a flameproof manner due to the elastic deformation of the wall section, comprising: selecting of the flange section and the second section for limiting the intermediate region of the housing, wherein the intermediate region is geometrically closed in a flameproof manner due to the elastic deformation of the wall section, wherein the explosion-proof housing is configured according to an explosion protection category of flame-proof enclosure as defined by the standard (DIN EN 600-79/1) and the interior of the explosion-proof housing is configured to arrange electrical or electronic components therein that could form ignition sources; wherein the flange section is a sheet and/or the second section is a sheet section; wherein a sheet thickness of the flange section and/or the second section is no greater than a maximum of 5 mm.

13. The method as in claim 12, further comprising:
assembly of the first housing part and the second housing part in order to close the housing, wherein the first face and the second face limit the intermediate region comprising a gap dimension outside a flameproof range,
applying a force on the flange section and the second section such that the flange section and the second section are pressed against one another under elastic deformation of the wall section such that the intermediate region is geometrically closed in a flameproof manner due to the elastic deformation of the wall section.

14. The method as in claim 13, wherein a path for closing the intermediate region, such that the intermediate region is flameproof, is predominantly travelled due to the deformation of the wall section.

15. The explosion-proof housing according to claim 1, wherein a sheet thickness of the flange section and/or the second section is no greater than maximum 3 mm.

16. The explosion-proof housing according to claim 15, wherein the flange section is part of the first housing part and the second section is part of the second housing part, wherein the flange section and the second section confine an angle in case of abutment of the first housing part on the second housing part in a non-clamped condition due to a geometric desired shape of the flange section and the second section.

17. The explosion-proof housing according to claim 16, wherein in abutment of the first housing part and the second housing part against one another in a non-clamped condition a width of the intermediate region increases from a support region in direction toward an environment of the housing and/or in a direction toward the interior due to a desired shape of the first housing part and the second housing part.

18. The explosion-proof housing according to claim 17, wherein the second section is supported on the flange section during flameproof closing of the intermediate region by elastic deformation in a defined support region directly or indirectly, wherein the defined support region forms an inner edge of the intermediate region and/or wherein the defined support region is arranged between an inner edge and an outer edge of the intermediate region.

* * * * *